(12) United States Patent
Park

(10) Patent No.: US 10,638,632 B2
(45) Date of Patent: Apr. 28, 2020

(54) ELECTRONIC DEVICE INCLUDING CABLE FIXING APPARATUS

(71) Applicants: Samsung Electronics Co., Ltd, Gyeonggi-do (KR); Pocons Co., Ltd., Gyeonggi-do (KR)

(72) Inventor: Jung Min Park, Gyeonggi-do (KR)

(73) Assignees: Samsung Electronics Co., Ltd., Suwon-si (KR); Pocons Co., Ltd., Suwon-si (KR)

(*) Notice: Subject to any disclaimer, the term of this patent is extended or adjusted under 35 U.S.C. 154(b) by 0 days.

(21) Appl. No.: 15/438,602

(22) Filed: Feb. 21, 2017

(65) Prior Publication Data

US 2017/0245386 A1    Aug. 24, 2017

(30) Foreign Application Priority Data

Feb. 19, 2016    (KR) .................... 10-2016-0019592

(51) Int. Cl.
*H01R 12/71* (2011.01)
*H05K 7/14* (2006.01)
(Continued)

(52) U.S. Cl.
CPC .......... *H05K 7/1427* (2013.01); *H01R 12/716* (2013.01); *H01R 12/75* (2013.01);
(Continued)

(58) Field of Classification Search
CPC ........ H05K 7/1427; H05K 1/14; H05K 3/301; H05K 3/368; H05K 5/0247; H05K 2201/04; H05K 2201/10356; H05K 3/341; H05K 2201/10606; H01R 12/716; H01R 12/75; H04M 1/0277; H02G 3/32
See application file for complete search history.

(56) References Cited

U.S. PATENT DOCUMENTS 4,023,758 A * 5/1977 Yuda .................... H02G 3/32
                                                      248/73
4,943,183 A * 7/1990 Nakano .............. H01J 29/925
                                                      24/297
(Continued)

FOREIGN PATENT DOCUMENTS

JP    2015223013    12/2015
KR    19990027329    7/1999

OTHER PUBLICATIONS

JP11-055835 English Translation.*

*Primary Examiner* — Steven T Sawyer

(57) ABSTRACT

An electronic device is provided. The electronic device includes a housing that includes a first surface facing a first direction, a second surface facing a second direction opposite to the first direction, and a side surface surrounding at least a portion of a space between the first surface and the second surface, a first printed circuit board seated inside the housing, a second printed circuit board seated inside the housing, a plurality of cables configured to electrically connect the first printed circuit board and the second printed circuit board, and at least one cable fixing apparatus coupled to the first printed circuit board or the second printed circuit board to accommodate and fix the plurality of cables. In addition, various embodiments identified through the specification are possible.

17 Claims, 22 Drawing Sheets

(51) Int. Cl.
  *H05K 3/36*   (2006.01)
  *H05K 5/02*   (2006.01)
  *H05K 3/30*   (2006.01)
  *H04M 1/02*   (2006.01)
  *H01R 12/75*  (2011.01)
  *H05K 1/14*   (2006.01)

(52) U.S. Cl.
  CPC ............ *H04M 1/0277* (2013.01); *H05K 1/14* (2013.01); *H05K 3/301* (2013.01); *H05K 3/368* (2013.01); *H05K 5/0247* (2013.01); H05K 2201/04 (2013.01); H05K 2201/10356 (2013.01)

(56) References Cited

U.S. PATENT DOCUMENTS

| | | | |
|---|---|---|---|
| 6,446,916 B2 * | 9/2002 | Takeda | F16B 7/0433 248/74.1 |
| 8,192,209 B1 * | 6/2012 | Li | H01R 4/64 174/40 CC |
| 2006/0185888 A1 * | 8/2006 | Yamada | H02G 3/32 174/135 |
| 2008/0137377 A1 | 6/2008 | Brengartner et al. | |
| 2012/0106053 A1 * | 5/2012 | Sun | H02G 3/32 361/679.02 |
| 2016/0150685 A1 * | 5/2016 | Kurita | H05K 9/0016 174/384 |

* cited by examiner

ELECTRONIC DEVICE INCLUDING CABLE FIXING APPARATUS

CROSS-REFERENCE TO RELATED APPLICATION(S) AND CLAIM OF PRIORITY

The present application is related to and claims the benefit under 35 U.S.C. § 119(a) of a Korean patent application filed on Feb. 19, 2016 in the Korean Intellectual Property Office and assigned Serial number 10-2016-0019592, the entire disclosure of which is hereby incorporated by reference.

TECHNICAL FIELD

The present disclosure relates to an electronic device including a cable fixing apparatus.

BACKGROUND

Electronic devices such as smartphones may include various electronic components for performing various functions. For example, an electronic device, a circuit line, or the like may be mounted on a printed circuit board. At least some of the electronic components mounted on the printed circuit board may be electrically connected with each other through cables. For example, opposite ends of a cable may be connected with a signal transmission side and a signal reception side provided on the printed circuit board, for transmission and reception of signals or electric power. Further, the cable may be fixed onto the printed circuit board by using a cable fixing apparatus, such as a clip, such that the cable may be prevented from being moved and the electronic components arranged around the cable may be prevented from being interfered by the cable.

The existing electronic device may be configured such that the cables are fixed by separate cable fixing apparatuses. For example, the cables may be fixed by the cable fixing apparatuses such that the cables are not overlaid on the printed circuit board. However, considering that the sizes of the electronic devices are becoming smaller, the mounting spaces for the electronic components may be restricted due to the arrangement spaces of the cables.

The above information is presented as background information only to assist with an understanding of the present disclosure. No determination has been made, and no assertion is made, as to whether any of the above might be applicable as prior art with regard to the present disclosure.

SUMMARY

To address the above-discussed deficiencies, it is a primary object to provide a cable fixing apparatus that may receive a plurality of cables.

In accordance with an aspect of the present disclosure, an electronic device includes a housing that comprises a first surface facing a first direction, a second surface facing a second direction that is opposite to the first direction, and a side surface surrounding at least a portion of a space between the first surface and the second surface, a first printed circuit board seated inside the housing, a second printed circuit board seated inside the housing, a plurality of cables configured to electrically connect the first printed circuit board and the second printed circuit board, and at least one cable fixing apparatus coupled to the first printed circuit board or the second printed circuit board to accommodate and fix the plurality of cables.

Other aspects, advantages, and salient features of the disclosure will become apparent to those skilled in the art from the following detailed description, which, taken in conjunction with the annexed drawings, discloses various embodiments of the present disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, it should be noted that like reference numbers are used to depict the same or similar elements, features, and structures.

DETAILED DESCRIPTION

Figure 1A:
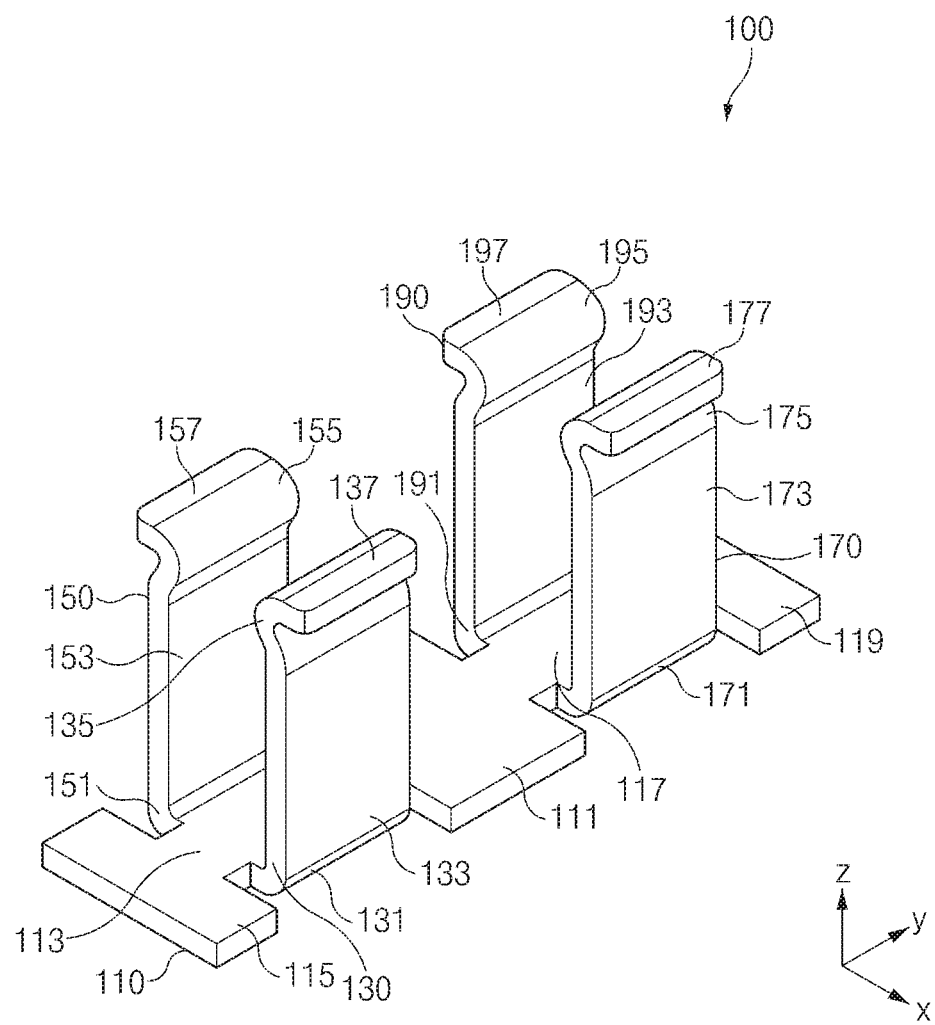
FIG. 1A is a perspective view of a cable fixing apparatus according to an embodiment.

FIGS. 1A through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device.

Hereinafter, various embodiments of the present disclosure are disclosed with reference to the accompanying drawings. However, the present disclosure is not intended to be limited by the various embodiments of the present disclosure to a specific embodiment and it is intended that the present disclosure covers all modifications, equivalents, and/or alternatives of the present disclosure provided they come within the scope of the appended claims and their equivalents. With respect to the descriptions of the accompanying drawings, like reference numerals refer to like elements.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The term "include," "comprise," and "have", or "may include," or "may comprise" and "may have" used herein indicates disclosed functions, operations, or existence of elements but does not exclude other functions, operations or elements.

For example, the expressions "A or B," or "at least one of A and/or B" may indicate A and B, A, or B. For instance, the expression "A or B" or "at least one of A and/or B" may indicate (1) at least one A, (2) at least one B, or (3) both at least one A and at least one B.

The terms such as "1st," "2nd," "first," "second," and the like used herein may refer to modifying various different elements of various embodiments of the present disclosure, but are not intended to limit the elements. For instance, "a first user device" and "a second user device" may indicate different users regardless of order or importance. For example, a first component may be referred to as a second component and vice versa without departing from the scope and spirit of the present disclosure.

In various embodiments of the present disclosure, it is intended that when a component (for example, a first component) is referred to as being "operatively or communicatively coupled with/to" or "connected to" another component (for example, a second component), the component may be directly connected to the other component or connected through another component (for example, a third component). In various embodiments of the present disclosure, it is intended that when a component (for example, a first component) is referred to as being "directly connected to" or "directly accessed" another component (for example, a second component), another component (for example, a third component) does not exist between the component (for example, the first component) and the other component (for example, the second component).

The expression "configured to" used in various embodiments of the present disclosure may be interchangeably used with "suitable for," "having the capacity to," "designed to," "adapted to," "made to," or "capable of" according to the situation, for example. The term "configured to" may not necessarily indicate "specifically designed to" in terms of hardware. Instead, the expression "a device configured to" in some situations may indicate that the device and another device or part are "capable of." For example, the expression "a processor configured to perform A, B, and C" may indicate a dedicated processor (for example, an embedded processor) for performing a corresponding operation or a general purpose processor (for example, a central processing unit (CPU) or application processor (AP)) for performing corresponding operations by executing at least one software program stored in a memory device.

Terms used in various embodiments of the present disclosure are used to describe certain embodiments of the present disclosure, but are not intended to limit the scope of other embodiments. The terms of a singular form may include plural forms unless they have a clearly different meaning in the context. Otherwise, all terms used herein may have the same meanings that are generally understood by a person skilled in the art. In general, terms defined in a dictionary should be considered to have the same meanings as the contextual meaning of the related art, and, unless clearly defined herein, should not be understood differently or as having an excessively formal meaning. In any case, even the terms defined in the present specification are not intended to be interpreted as excluding embodiments of the present disclosure.

An electronic device according to various embodiments of the present disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) Audio Layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit).

In some various embodiments of the present disclosure, an electronic device may be a home appliance. The smart home appliance may include at least one of, for example, a television (TV), a digital video/versatile disc (DVD) player, an audio, a refrigerator, an air conditioner, a cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., Xbox™ or PlayStation™), an electronic dictionary, an electronic key, a camcorder, or an electronic picture frame.

In other various embodiments of the present disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller machine (ATM), a point of sales (POS) device of a store, or an Internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like).

According to various embodiments of the present disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like). An electronic device may be one or more combinations of the above-mentioned devices. An electronic device according to some various embodiments of the present disclosure may be a flexible device. An electronic device according to an embodiment of the present disclosure is not limited to the above-mentioned devices, and may include new electronic devices with the development of new technology.

Hereinafter, an electronic device according to various embodiments of the present disclosure will be described in more detail with reference to the accompanying drawings. The term "user" used herein may refer to a person who uses an electronic device or may refer to a device (e.g., an artificial intelligence electronic device) that uses an electronic device.

Figure 1B:
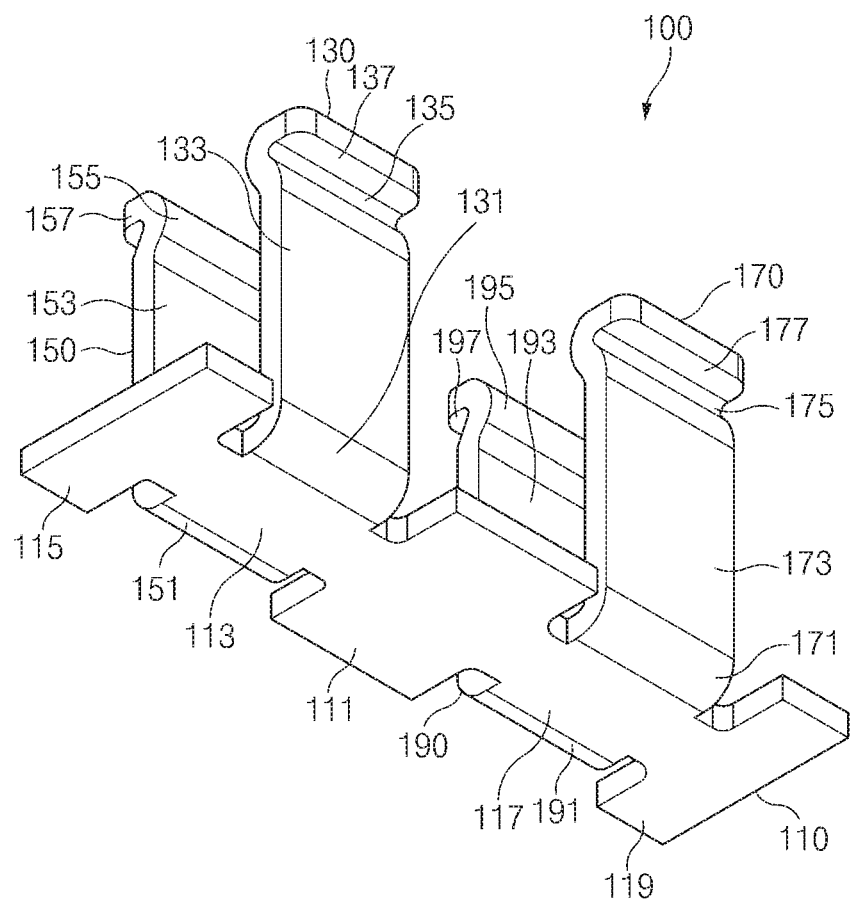
FIG. 1B is a bottom perspective view of a cable fixing apparatus according to an embodiment.
Figure 1C:
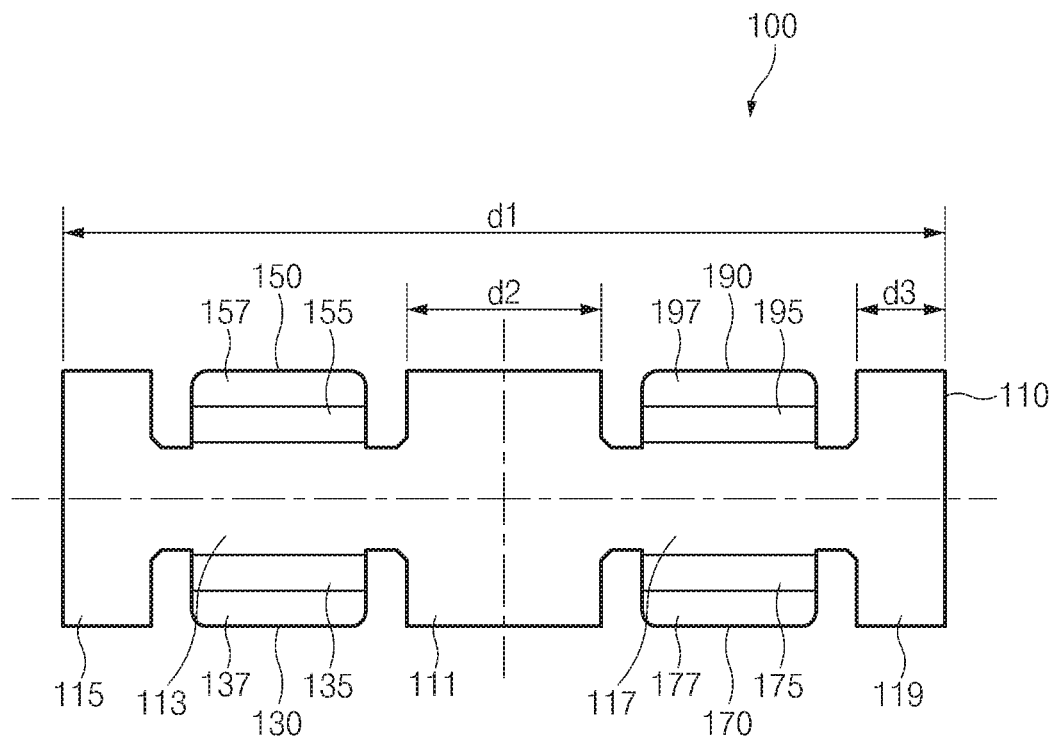
FIG. 1C is a plan view of a cable fixing apparatus according to an embodiment.
Figure 1D:
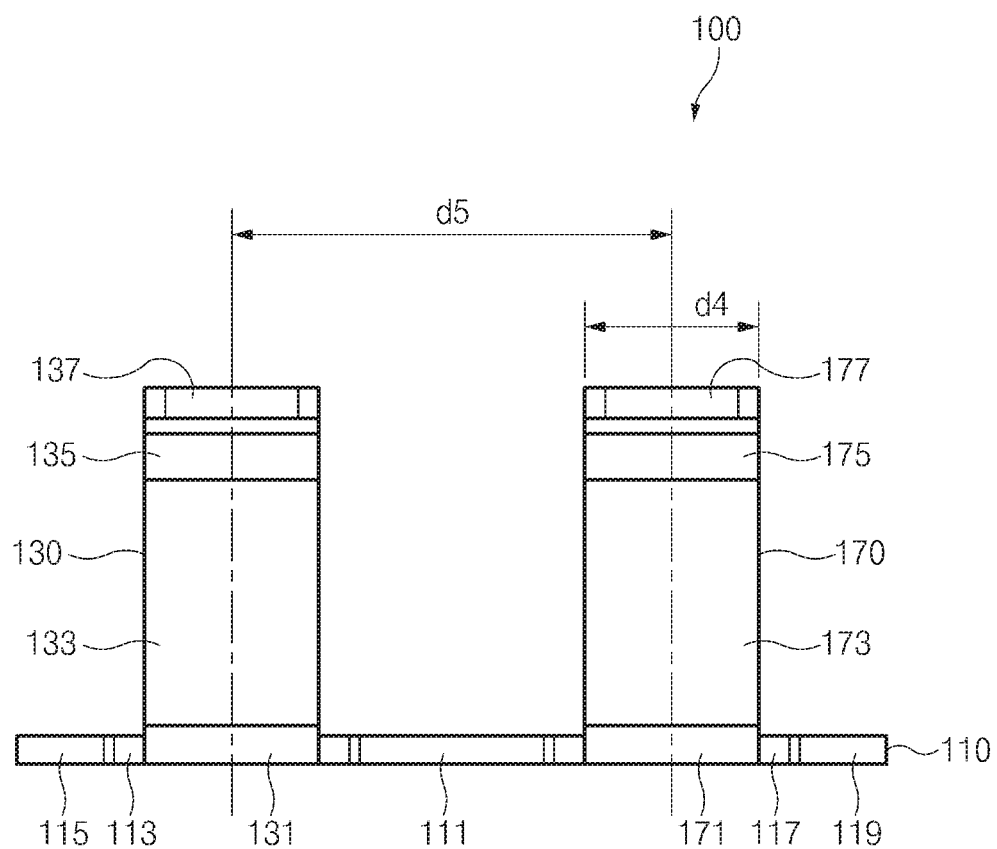
FIG. 1D is a front view of a cable fixing apparatus according to an embodiment.
Figure 1E:
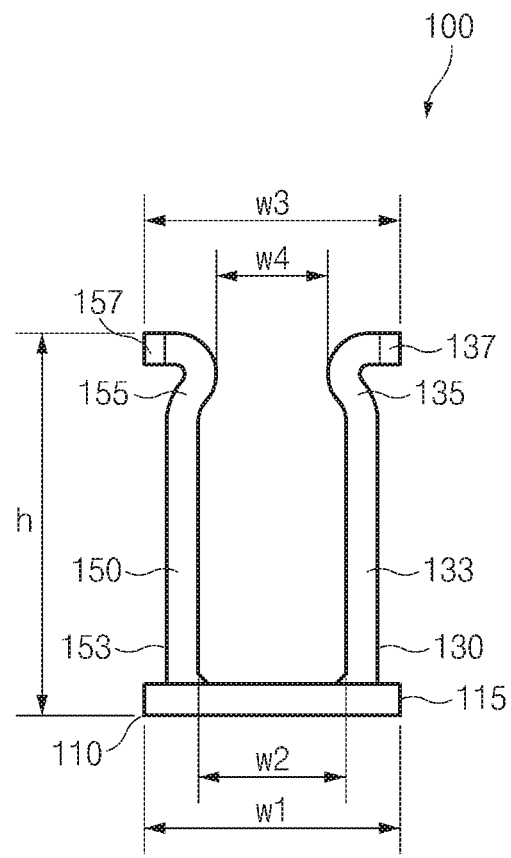
FIG. 1E is a side view of a cable fixing apparatus according to an embodiment.
Figure 1F:
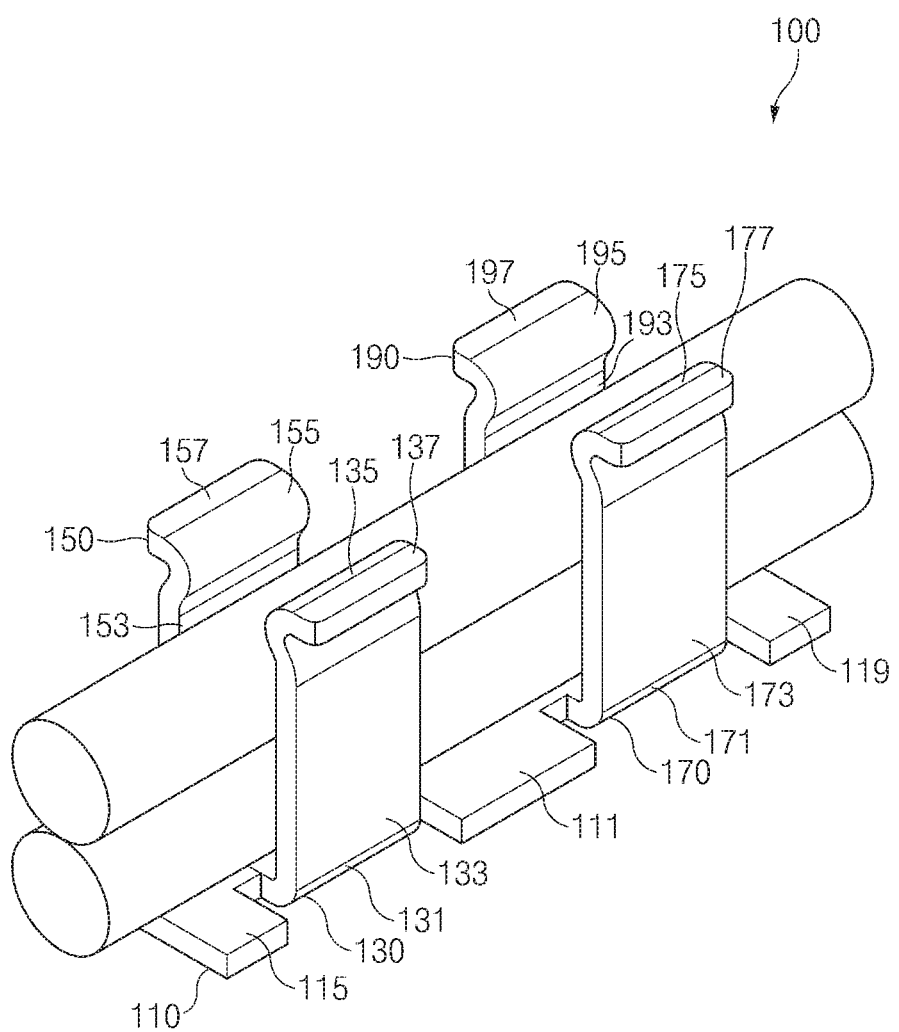
FIG. 1F is a perspective view of a cable fixing apparatus in a state in which a plurality of cables are inserted into the cable fixing apparatus according to an embodiment.

FIG. 1A is a perspective view of a cable fixing apparatus according to an embodiment. FIG. 1B is a bottom perspective view of a cable fixing apparatus according to an embodiment. FIG. 1C is a plan view of a cable fixing apparatus according to an embodiment. FIG. 1D is a front view of a cable fixing apparatus according to an embodiment. FIG. 1E is a side view of a cable fixing apparatus according to an embodiment. FIG. 1F is a perspective view of a cable fixing apparatus in a state in which a plurality of cables are inserted into the cable fixing apparatus according to an embodiment.

Referring to FIGS. 1A to 1F, the cable fixing apparatus 100 for fixing a plurality of cables may include a coupling part 110, a first fixing part 130, a second fixing part 150, a third fixing part 170, and a fourth fixing part 190. The coupling part 110 may be coupled and fixed to a printed circuit board of the electronic device. According to an embodiment, the coupling part 110 may define a bottom of the cable fixing apparatus 100, and a lower surface of the coupling part 110 contacts the printed circuit board and a portion of the lower surface of the coupling part 110 may be coupled to the printed circuit board through soldering or the like.

The coupling part 110 may include a central portion 111, a first peripheral portion 115, a second peripheral portion 119, a first extending portion 113, and a second extending portion 117. The first peripheral portion 115 and the second peripheral portion 119 may be formed at left and right peripheral areas of the coupling part 110, and may be connected with the central portion 111 situated in a central area of the coupling part 110 through the first extending portion 113 and the second extending portion 117. According to an embodiment, the first extending portion 113 may extend from a left side surface of the central portion 111, and may be connected with a right side surface of the first peripheral portion 115. As another embodiment, the second extending portion 117 may extend from a right side surface of the central portion 111, and may be connected with a left side surface of the second peripheral portion 119.

According to an embodiment, the lower surfaces of the central portion 111, the first peripheral portion 115, and the second peripheral portion 119 may be areas that are soldered when the cable fixing apparatus 100 is coupled to the printed circuit board through a surface mounting technology (SMT). However, the present disclosure is not limited thereto. In some embodiments, solder may be applied to the lower surfaces of the first extending portion 113 and the second extending portion 117.

The first fixing part 130, the second fixing part 150, the third fixing part 170, and the fourth fixing part 190 may fix the cables inserted into the cable fixing apparatus 100 such that the cables are not separated to the outside. According to an embodiment, portions of inner surfaces of at least some of the fixing parts may protrude inwards such that the inserted cables are not separated to the outside. The above-described fixing parts may be installed in upright position at opposite sides of the coupling part 110 to face each other in a widthwise direction (or the x axis direction) of the coupling part 110, and at least one pair of fixing parts may be provided in the widthwise direction (or the x axis direction) of the coupling part 110. The drawing illustrates a state in which the first fixing part 130 and the second fixing part 150 form a pair and the third fixing part 170 and the fourth fixing part 190 form another pair.

According to various embodiments, the fixing parts are installed in upright positions on the first extending portion 113 and the second extending portion 117 to define side walls of the cable fixing apparatus 100. According to an embodiment, the first fixing part 130 and the second fixing part 150 may be installed in an upright position on the first extending portion 113, and the third fixing part 170 and the fourth fixing part 190 may be installed on the second extending portion 117.

Each of the fixing parts may include a lower end portion, an intermediate portion, an upper end portion, and an upper peripheral portion. As illustrated in the drawing, the first fixing part 130 may include a first lower end portion 131, a first intermediate portion 133, a first upper end portion 135, and a first upper peripheral portion 137, the second fixing part 150 may include a second lower end portion 151, a second intermediate portion 153, a second upper end portion 155, and a second upper peripheral portion 137, the third fixing part 170 may include a third lower end portion 171, a third intermediate portion 173, a third upper end portion 175, and a third upper peripheral portion 177, and the fourth fixing part 190 may include a fourth lower end portion 191, a fourth intermediate portion 193, a fourth upper end portion 195, and a fourth upper peripheral portion 197.

The lower end portions of the fixing parts may extend from side surfaces of the extending portions, respectively, and may be bent in a heightwise direction (or the z axis direction) of the cable fixing apparatus 100. As illustrated in the drawing, the first lower end portion 131 may extend from a widthwise direction surface of the first extending portion 113 and may be bent in a heightwise direction of the cable fixing apparatus 100, and the second lower end portion 151 may extend from a widthwise direction surface of the first extending portion 113 and may be bent in a heightwise direction of the cable fixing apparatus 100. Further, the third lower end portion 171 may extend from a widthwise direction surface of the second extending portion 117 and may be bent in a heightwise direction of the cable fixing apparatus 100, and the fourth lower end portion 191 may extend from a widthwise direction surface of the second extending portion 117 and may be bent in a heightwise direction of the cable fixing apparatus 100. However, the present disclosure is not limited thereto. In some embodiments, the first lower end portion 131 and the second lower end portion 151 may extend from peripheries of the first extending portion 113 in a heightwise direction of the cable apparatus 100 by a specific length, and the third lower end portion 171 and the fourth lower end portion 191 may extend from peripheries of the second extending portion 117 in a heightwise direction of the cable apparatus 100 by a specific length.

The intermediate portions of the fixing parts may extend from the lower end portions of the fixing parts by a specific length in a heightwise direction of the cable fixing apparatus 100 to define the side walls of the cable fixing apparatus 100. As illustrated in the drawing, the first intermediate portion 133 may extend from the first lower end portion 131 by a specific length in a heightwise direction of the cable fixing apparatus 100 to define a side wall on a left lengthwise direction and a widthwise direction of the cable fixing apparatus 100, and the second intermediate portion 153 may extend from the second lower end portion 151 by a specific length in a heightwise direction of the cable fixing apparatus 100 to define a side wall on a left lengthwise direction and an opposite widthwise direction of the cable fixing apparatus 100. Further, the third intermediate portion 173 may extend from the third lower end portion 171 by a specific length in a heightwise direction of the cable fixing apparatus 100 to define a side wall on a right lengthwise direction and a widthwise direction of the cable fixing apparatus 100, and the fourth intermediate portion 193 may extend from the fourth lower end portion 191 by a specific length in a heightwise direction of the cable fixing apparatus 100 to define a side wall on a right lengthwise direction and an opposite widthwise direction of the cable fixing apparatus 100

The upper end portions of the fixing parts may have shapes that extend from the intermediate portions of the fixing parts and protrude to the inner widthwise direction of the coupling parts. According to an embodiment, each of the upper end portions may include a first section that extends from the corresponding intermediate portion to the inner widthwise direction of the coupling part 110 by a first length to be inclined upwards, and a second section that extends from the corresponding first section to the outer widthwise direction of the coupling part 110 by a second length to be inclined upwards. As another embodiment, an area in which the first section and the second section are connected with each other may be bent at a specific curvature. As illustrated in the drawing, the first upper end portion 135 may have a shape that extends from the first intermediate portion 133 and protrudes to the inner widthwise direction of the coupling part 110, and the second upper end portion 155 may have a shape that extends from the second intermediate portion 153 and protrudes to the inner widthwise direction of the coupling part 110. Further, the third upper end portion 175 may have a shape that extends from the third intermediate portion 173 and protrudes to the inner widthwise direction of the coupling part 110, and the fourth upper end portion 195 may have a shape that extends from the fourth intermediate portion 193 and protrudes to the inner widthwise direction of the coupling part 110.

The upper end portions of the fixing parts may prevent the cables from being stabbed by the fixing part, and may prevent the cables from being separated to the outside after the cables are inserted. For example, the cables may be prevented from being stabbed by the fixing part in a process of inserting the cables due to the second sections that are included upwards to the outer widthwise direction of the coupling part 110, and the cables may be prevented from being separated after the cables are inserted, due to the first sections that are inclined upwards to the inner widthwise direction of the coupling part 110.

Each of the upper peripheral portions of the fixing parts may extend from the corresponding upper end portions to the outer widthwise direction of the coupling part 110 by a specific length. As illustrated in the drawing, the first upper peripheral portion 137 may extend from the corresponding first upper end portion 135 to the outer widthwise direction of the coupling part 110 by a specific length, and the second upper peripheral portion 157 may extend from the corresponding second upper end portion 155 to the outer widthwise direction of the coupling part 110 by a specific length. Further, the third upper peripheral portion 177 may extend from the corresponding third upper end portion 175 to the outer widthwise direction of the coupling part 110 by a specific length, and the fourth upper peripheral portion 197 may extend from the corresponding fourth upper end portion 195 to the outer widthwise direction of the coupling part 110 by a specific length.

The cable fixing apparatus 100 including the above-described elements may have a length d1, a width w1, and a height h of specific sizes or more such that the plurality of cables may be fixed, be prevented from being inclined or separated from the printed circuit board by an external force.

For example, the cable fixing apparatus 100 may have a length of 4.50 mm, a width of 1.30 mm, and a height of 1.95 mm. However, the present disclosure is not limited thereto. The length, width, and height of the cable fixing apparatus 100 may be differently determined depending on the size of an electronic device, to which the cable fixing apparatus is coupled, the size and form of the printed circuit board, the number and diameter of the cables that may be received by the cable fixing apparatus 100, or the like. For example, as the number of the cables that may be received by the cable fixing apparatus 100 increases, the length, width, and height of the cable fixing apparatus 100 also increase.

According to an embodiment, the central portion 111, the first peripheral portion 115, the second peripheral portion 119, the first extending portion 113, and the second extending portion 117 of the coupling part 110 may correspond to the length and width of the cable fixing apparatus 100. As an example, the length d2 of the central portion 111 may be 1.00 mm, and the first peripheral portion 115 and the second peripheral portion 119 may have the same length d3 of 0.45 mm. However, the present disclosure is not limited thereto. In some embodiments, the central portion 111, the first peripheral portion 115, and the second peripheral portion 119 may have the same length. However, in the case in which the central portion 111 acts as a pickup surface of the cable fixing apparatus 100 when the cable fixing apparatus 100 is mounted on the printed circuit board through a surface mounting technology, it is preferable that the length of the central portion 111 be longer than the lengths of the first peripheral portion 115 and the second peripheral portion 119 to secure a sufficient pickup surface. As another example, the first extending portion 113 and the second extending portion 117 have the same length of 1.30 mm. The lengths of the first extending portion 113 and the second extending portion 117 may be larger than the length d4 of the fixing parts. As another example, the central portion 111, the first peripheral portion 115, and the second peripheral portion 119 have the same width of 1.30 mm, and the first extending portion 113 and the second extending portion 117 may have the same width of 0.75 mm. However, the present disclosure is not limited thereto. In some embodiments, the widths of the first extending portion 113 and the second extending portion 117 may be the same as those of the central portion 111, the first peripheral portion 115, and the second peripheral portion 119. However, when the fixing parts extend from the first extending portion 113 and the second extending portion 117, the width of the cable fixing apparatus 100 may become larger than the width of the coupling part 110 due to the thickness of the fixing parts. In order to prevent this, the widths of the first extending portion 113 and the second extending portion 117 may be smaller than those of the central portion 111, the first peripheral portion 115, and the second peripheral portion 119.

According to an embodiment, the length d4 of the fixing parts, the interval d5 between the centers of the fixing parts arranged in the lengthwise direction of the coupling part 110, and the interval w2 between the fixing parts that are paired to face each other at the opposite widthwise directions of the coupling parts 110 may be differently determined depending on the number, the diameter, and the fixing form of the cables inserted into the cable fixing apparatus 100. For example, the length of the fixing parts may be 0.90 mm, the interval between the centers of the fixing parts arranged in the lengthwise direction of the coupling part 110 may be 2.30 mm, and the interval between the fixing parts that are paired to face each other at opposite widthwise directions of the coupling part 110 may be 0.75 mm. However, the present disclosure is not limited thereto, and as the number of the cables inserted into the cable fixing apparatus 100 increases and the diameter of the cables increases, the length of the fixing parts and the interval between the centers of the fixing parts arranged in the lengthwise direction of the coupling parts may increase. Further, when a plurality of cables are fixed in parallel to each other in the widthwise direction of the cable fixing apparatus 100, the interval between the fixing parts that are paired to face each other at opposite widthwise directions of the coupling part 110 may be differently determined depending on the number and diameter of the cables that are fixed in parallel to each other. As another example, when a plurality of cables are stacked and fixed in the heightwise direction of the cable fixing apparatus 100, the height of the fixing parts may be differently determined depending on the number and diameter of the stacked cables.

According to an embodiment, the interval w4 between the upper end portions of the fixing parts that are paired to face each other at the opposite widthwise direction of the coupling part 110 may be differently determined depending on the diameters of the cables. For example, it is preferable that as the diameters of the cables increases, the interval between the upper end portions of the fixing parts that are paired to face each other at the opposite widthwise direction of the coupling part 110 be large enough such that the cables may be easily inserted into the cable fixing apparatus 100. For example, when the diameters of the cables correspond to 0.81 mm, the interval between the upper end portions of the fixing parts that are paired to face each other at the opposite widthwise direction of the coupling part 110 may be 0.56 mm.

According to an embodiment, the interval w3 between the upper peripheral portions of the fixing parts that are paired to face each other at the opposite widthwise direction of the coupling part 110 may be the same as or similar to the width of the coupling part 110. For example, the interval between the upper peripheral portions of the fixing parts that are paired to face each other at the opposite widthwise direction of the coupling part 110 may be 1.30 mm.

According to various embodiments, the central portion 111 may be excluded from the coupling part 110. In this case, one of the first extending portion 113 that connects the central portion 111 and the first peripheral portion 115 or the second extending portion 117 that connects the central portion 111 and the second peripheral portion 119 may be excluded, and the remaining one may connect the first peripheral portion 115 and the second peripheral portion 119. Further, as one of the first extending portion 113 or the second extending portion 117 is excluded, the fixing parts installed in upright positions in the excluded extending portions may be excluded. For example, when the second extending portion 117 is excluded and the first extending portion 113 connects the first peripheral portion 115 and the second peripheral portion 119, the third fixing part 170 and the fourth fixing part 190 installed in the second extending portion 117 in an upright position may be excluded.

According to various embodiments, the central portion 111 of the coupling part 110 may be divided into a plurality of areas. In this case, the coupling part 110 may further include at least one extension that connects the divided areas of the central portion 111. Further, the cable fixing apparatus 100 may further include at least one pair of fixing parts that are installed in the further included at least one extension.

In a description of a process of inserting and fixing a plurality of cables to the cable fixing apparatus 100, the cables may be pressed to and inserted into between the upper end portions of the fixing parts that are paired to face each other at opposite widthwise directions of the coupling part 110. Then, the second sections of the upper end portions, which are inclined upwards to the outer widthwise direction of the coupling part 110, function to guide the cables between the fixing parts. When the cables are inserted to the lower sides of the upper end portions of the fixing parts while the fixing parts are resiliently deformed and widened to the outer widthwise directions of the coupling part 110 when the cables are inserted and the fixing parts return to the original state while the cables are completely inserted, the cables inserted to the lower sides of the upper end portions of the fixing parts are stopped by the first sections of the upper end portions that are inclined upwards to the inner widthwise direction of the coupling part 110 and are fixed to the cable fixing apparatus 100. Further, the plurality of cables fixed between the fixing parts may be fixed to the cable fixing apparatus 100 as long as an external force is not applied to between the fixing parts such that the fixing parts are widened.

Figure 2A:
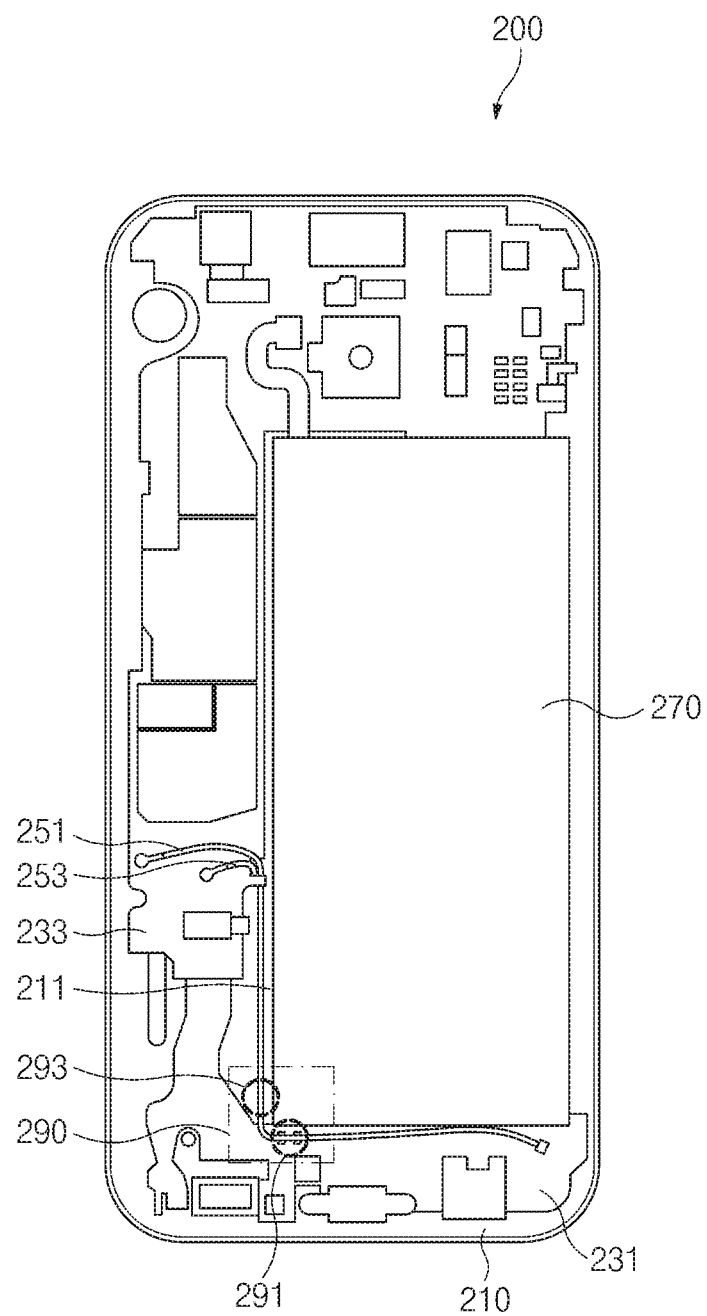
FIG. 2A is a view illustrating a location, to which the cable fixing apparatus is applied, according to an embodiment.
Figure 2B:
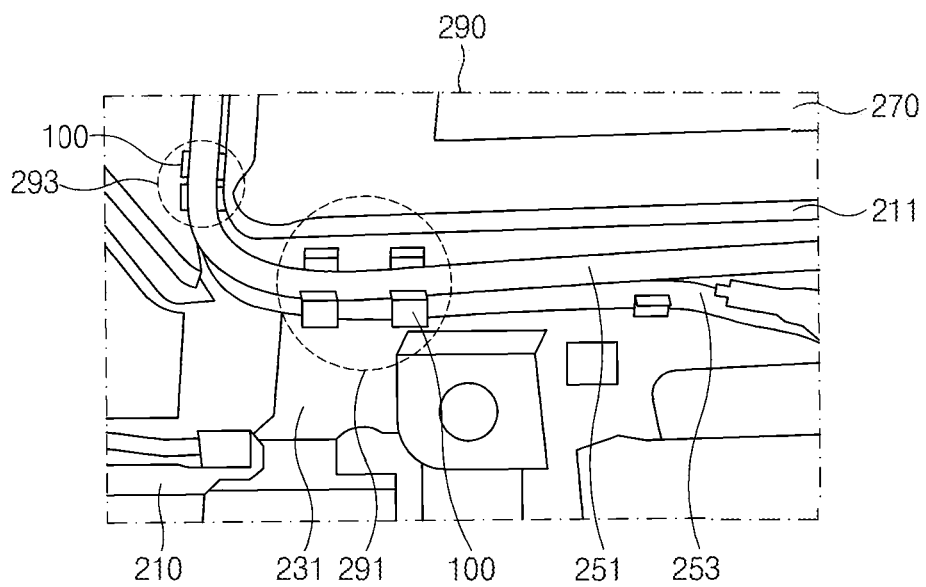
FIG. 2B is an enlarged view illustrating a location, to which the cable fixing apparatus is applied, according to an embodiment.

FIG. 2A is a view illustrating a location, to which the cable fixing apparatus is applied, according to an embodiment. FIG. 2B is an enlarged view illustrating a location, to which the cable fixing apparatus is applied, according to an embodiment.

Referring to FIGS. 2A and 2B, the electronic device 200 may include a housing 210 that fixes and supports internal components (e.g., a display, a bracket, and a printed circuit board), and a battery 270 that supplies electric power to at least one of the internal elements. The housing 210 may include a front surface, a rear surface, and a side surface that partially surrounds a space between the front surface and the rear surface. The drawing illustrates that a first printed circuit board 231 and a second printed circuit board 233 are seated in and fixed to the housing 210. According to an embodiment, the housing 210 may include a battery frame 211 that is provided such that the battery 270 may be seated in an area of the housing 210. The battery frame 211 may have a size and a shape that are the same as or similar to those of the battery 270.

Various electronic components may be mounted on the first printed circuit board 231 and the second printed circuit board 233. For example, a processor, a memory, a communication module, or a function module may be mounted on the first printed circuit board 231 and the second printed circuit board 233. At least some of the electronic components mounted on the first printed circuit board 231 and the second printed circuit board 233 may be electrically connected with each other. For example, an RF signal may be transmitted through an RF cable (e.g., a coaxial cable). The drawing illustrates that a first cable 251 and a second cable 253 connect the first printed circuit board 231 and the second printed circuit board 233.

According to various embodiments, at least one of the cables may be fixed onto the printed circuit board by using a cable fixing apparatus 100 such that the cable is prevented from being moved and the electronic components arranged around the cable are prevented from being interfered by the cable. As illustrated in the drawing, the cable fixing apparatus 100 may fix the first cable 251 and the second cable 253.

According to various embodiments, the cables may be arranged along an inner surface of the housing 210 or along an outer surface of a structure arranged inside the housing 210 such that the electronic components mounted on the printed circuit board may be prevented from being interfered by the cables. For example, as illustrated in the drawing, the cables may be arranged along the outer surface of a battery frame 211. In this case, in an area (e.g., a corner area 290 of the battery frame 211) in which the cables are bent, a force by which the cables are to be moved by the resilient force of the cables may be larger than those in another area. Accordingly, it is preferable that the cables be fixed by using the cable fixing apparatus 100 in areas (e.g., a first area 291 and a second area 293) that are adjacent to the area in which the cables are bent. The drawing illustrates a state in which the first cable 251 and the second cable 253 are fixed by the cable fixing apparatus 100 in the first area 291. In some embodiments, the plurality of cables may be fixed by using the cable fixing apparatus 100 in the second area 293 and/or another area.

Figure 3A:
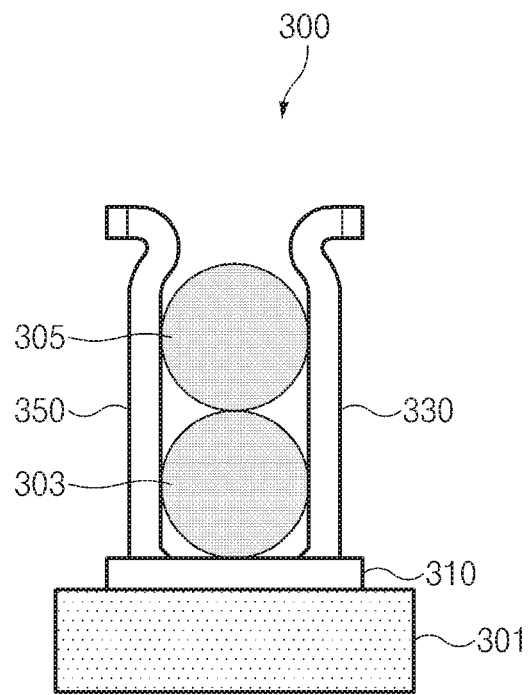
FIG. 3A is a view illustrating a cable fixing apparatus that is coupled onto a printed circuit board according to an embodiment.
Figure 3B:
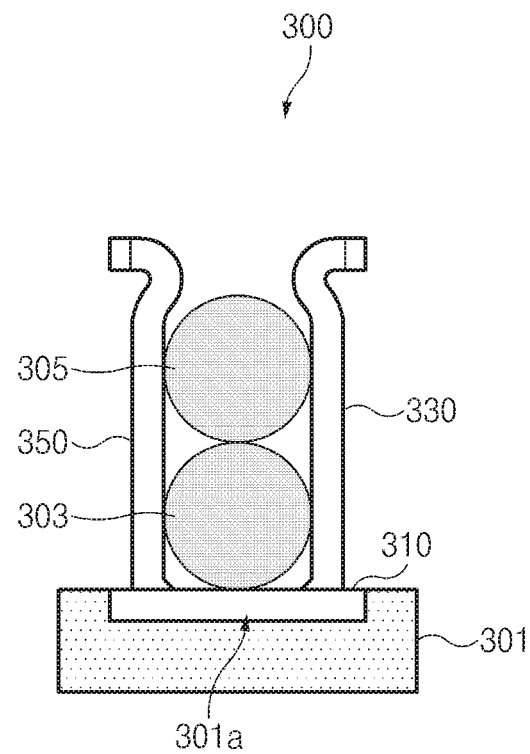
FIG. 3B is a view illustrating a cable fixing apparatus that is coupled to a recess of a printed circuit board according to an embodiment.
Figure 3C:
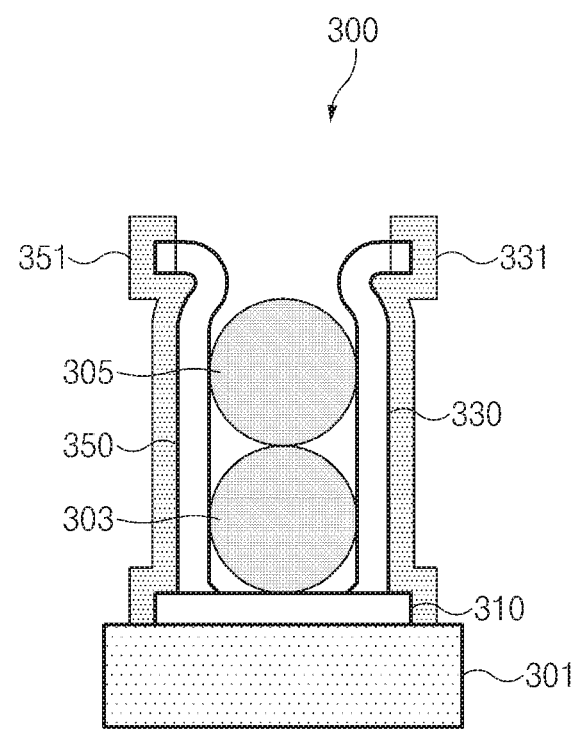
FIG. 3C is a view illustrating a state in which an insulation layer is formed in the cable fixing apparatus coupled onto a printed circuit board according to an embodiment.

FIG. 3A is a view illustrating a cable fixing apparatus that is coupled onto a printed circuit board according to an embodiment. FIG. 3B is a view illustrating a cable fixing apparatus that is coupled to a recess of a printed circuit board according to an embodiment. FIG. 3C is a view illustrating a state in which an insulation layer is formed in the cable fixing apparatus coupled onto a printed circuit board according to an embodiment.

Referring to FIG. 3A to 3C, the cable fixing apparatus 300 may be fixed onto the printed circuit board 301. According to an embodiment, a coupling part 310 that defines the bottom of the cable fixing apparatus 300 may be coupled to the printed circuit board 301. Further, the fixing parts that extend from the coupling part 310 in a heightwise direction of the cable fixing apparatus 300 may define the side walls of the cable fixing apparatus 300. The drawing illustrates a state in which the first fixing part 330 and the second fixing part 350 define the side walls of the cable fixing apparatus 300 and the first cable 303 and the second cable 305 are inserted and fixed between the first fixing part 330 and the second fixing part 350.

According to various embodiments, the coupling part 310 may be formed of a metal to be mounted on a surface of the printed circuit board 301. In this case, the coupling part 310 may be utilized as a ground area of the cable inserted into the cable fixing apparatus 300. As another example, the fixing parts that fix the cable may include a conductive material, and may be utilized as a ground area of the cable that contacts the fixing parts.

According to various embodiments, a conductive layer may be partially recessed to prevent electrical components mounted on the printed circuit board from being electrically influenced when the coupling part 310 formed of a metal is coupled to the printed circuit board 301. As illustrated in FIG. 3B, an area 301a of the printed circuit board 301, in which the cable fixing apparatus 300 is seated, may be coupled to the coupling part 310.

According to various embodiments, an insulation layer may be included on an outer surface of the cable fixing apparatus 300 to prevent the electronic components arranged adjacent to the cable fixing apparatus 300 from being electrically influenced by the cable fixing apparatus 300. According to an embodiment, as illustrated in FIG. 3C, an insulation material is coated on right side surfaces of the first fixing part 330 and the coupling part 310 to define a first insulation layer 331, and an insulation material is coated on left side surfaces of the second fixing part 350 and the coupling part 310 to define a second insulation layer 351.

Figure 4A:
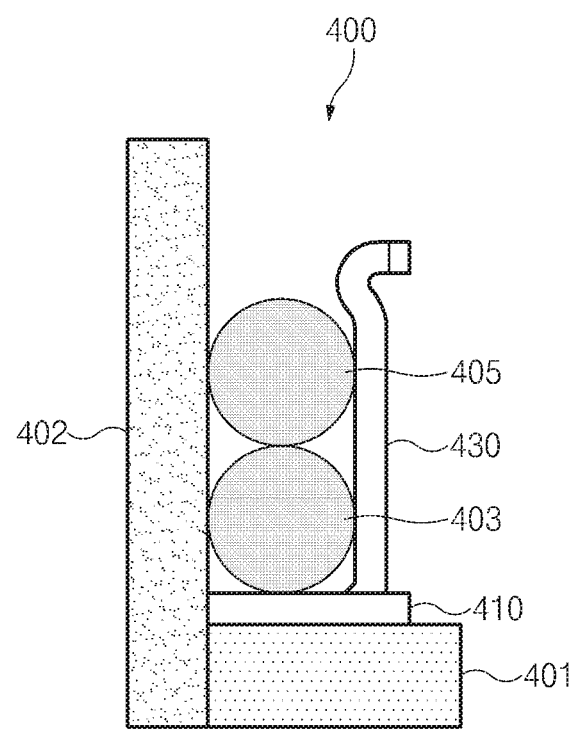
FIG. 4A is a view illustrating a cable fixing apparatus that is arranged adjacent to a structure according to an embodiment.
Figure 4B:
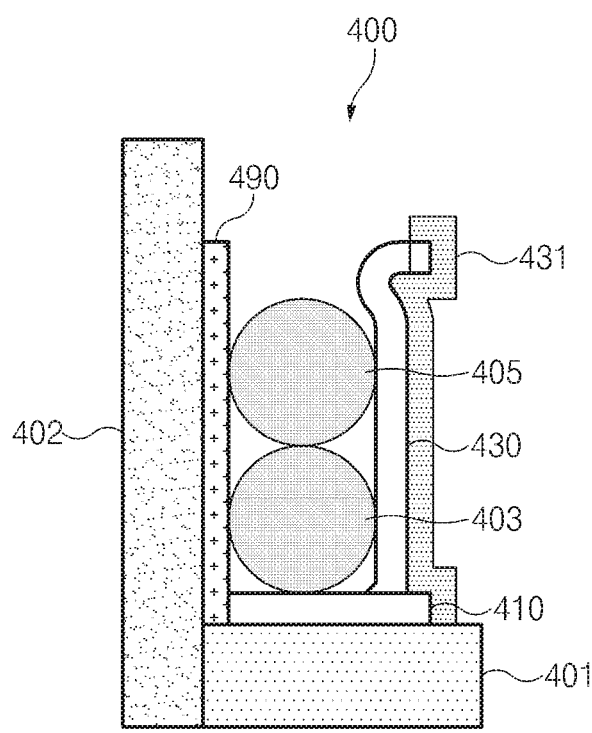
FIG. 4B is a view illustrating a state in which an insulation member is arranged between a structure and a cable fixing apparatus according to an embodiment.

FIG. 4A is a view illustrating a cable fixing apparatus that is arranged adjacent to a structure according to an embodiment. FIG. 4B is a view illustrating a state in which an insulation member is arranged between a structure and a cable fixing apparatus according to an embodiment.

Referring to FIGS. 4A and 4B, the cable fixing apparatus 400 may be arranged adjacent to the inner surface of a housing (e.g., the housing 210) or the outer surface of the structure 402 provided within the electronic device. The structure 402, for example, may be a battery frame (e.g., the battery frame 211) that is provided such that a battery (e.g., the battery 270) may be seated on the structure 402.

According to various embodiments, when the cable fixing apparatus 400 is arranged adjacent to the inner surface of the housing or the outer surface of the structure 402, the inner surface of the housing or the outer surface of the structure 402 may be utilized as the side wall of the cable fixing apparatus 400. As illustrated in FIG. 4A, the cable fixing apparatus 400 may be coupled to the printed circuit board 401 as a coupling part 410 that defines the bottom of the cable fixing apparatus 400 is attached to the structure 402, a first fixing part 430 may extend from the coupling part 410 in a heightwise direction of the cable fixing apparatus 300, and a side wall of the cable fixing apparatus 400 may be formed on a side that is opposite to the side of the structure 402. In this case, the outer surface of the structure 402 and the first fixing part 430 may define opposite side walls of the cable fixing apparatus 400, and a first cable 403 and a second cable 405 may be inserted and fixed between the outer surface of the structure 402 and the first fixing part 430.

According to various embodiments, when the structure 402 is formed of a conductive material, an insulation member 490 may be arranged between the cable fixing apparatus 400 and the outer surface of the structure 402 to prevent the structure 402 from being electrically influenced by the cable fixing apparatus 400 and the cables inserted into the cable fixing apparatus 400. Further, an insulation layer 431 may be coated on the outer surfaces of the first fixing part 430 and the coupling part 410.

According to various embodiments, the cable fixing apparatus (e.g., the cable fixing apparatus 300 and the cable fixing apparatus 400) may be configured such that a plurality of cables are stacked and fixed in a heightwise direction of the cable fixing apparatus. However, the present disclosure is not limited thereto. The plurality of cable may be fixed in parallel in a widthwise direction as well as a heightwise direction of the cable fixing apparatus.

Figure 5A:
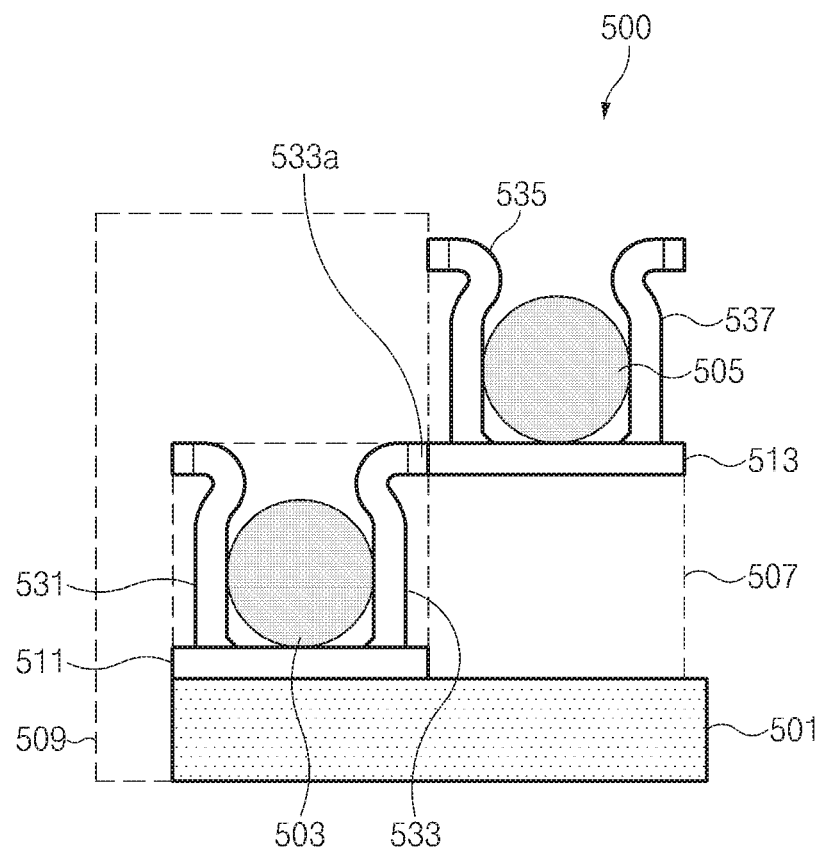
FIG. 5A is a view illustrating a cable fixing apparatus that include a plurality of stepped coupling parts according to an embodiment.
Figure 5B:
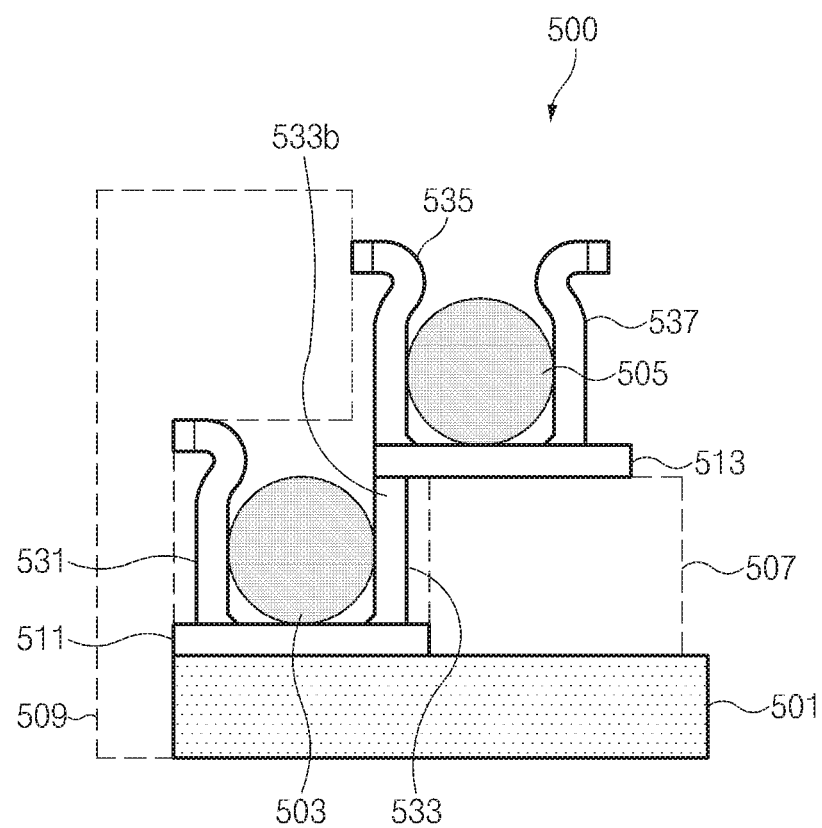
FIG. 5B is a view illustrating another form of a cable fixing apparatus that include a plurality of stepped coupling parts according to an embodiment.

FIG. 5A is a view illustrating a cable fixing apparatus that include a plurality of stepped coupling parts according to an embodiment. FIG. 5B is a view illustrating another form of a cable fixing apparatus that include a plurality of stepped coupling parts according to an embodiment.

According to various embodiments, the cable fixing apparatus 500 may include a plurality of stepped coupling parts. As illustrated in FIG. 5A, the cable fixing apparatus 500 may be configured such that a second coupling part 513 is formed at a location that is higher than that of a first coupling part 511. The cable fixing apparatus 500 may include a first coupling part 511 that is coupled to a printed circuit board 501, a first fixing part 531 and a second fixing part 533 that extend from the first coupling part 511 in a heightwise direction of the cable fixing apparatus 500, a second coupling part 513 that extends from an upper peripheral portion 533a of the second fixing part 533 to a side, on which the first fixing part 531 is arranged, to be parallel to the first coupling part 511, and a third fixing part 535a and a fourth fixing part 537 that extend from the second coupling part 513 in a heightwise direction of the cable fixing apparatus 500. In this case, the first cable 503 may be inserted and fixed between the first fixing part 531 and the second fixing part 533, and the second cable 505 may be inserted and fixed between the third fixing part 535 and the fourth fixing part 537. However, the present disclosure is not limited thereto. In some embodiments, at least one pair of the first fixing part 531 and the second fixing part 533, or the third fixing part 535 and the fourth fixing part 537 may have a large height to fix a plurality of cables. For example, the first fixing part 531 and the second fixing part 533 may have a large height such that a third cable (not illustrated) as well as the first cable 503 may be inserted and fixed between the first fixing part 531 and the second fixing part 533.

According to various embodiments, an upper end portion and an upper peripheral portion of the second fixing part 533 may be excluded to reduce the width and height of the cable fixing apparatus 500. As illustrated in FIG. 5B, an upper end portion and an upper peripheral portion of the second fixing part 533 may be excluded, and the second coupling part 513 may be arranged on the intermediate portion 533b of the second fixing part 533.

According to various embodiments, the cable fixing apparatus 500 includes the plurality of stepped coupling parts, and empty spaces may be provided on the right side of the second fixing part 533 and the left side of the third fixing part 535. The electronic components 507 arranged on the printed circuit board 501 or the structures 509 provided in the interior of the electronic device may be situated in the empty spaces.

Figure 6:
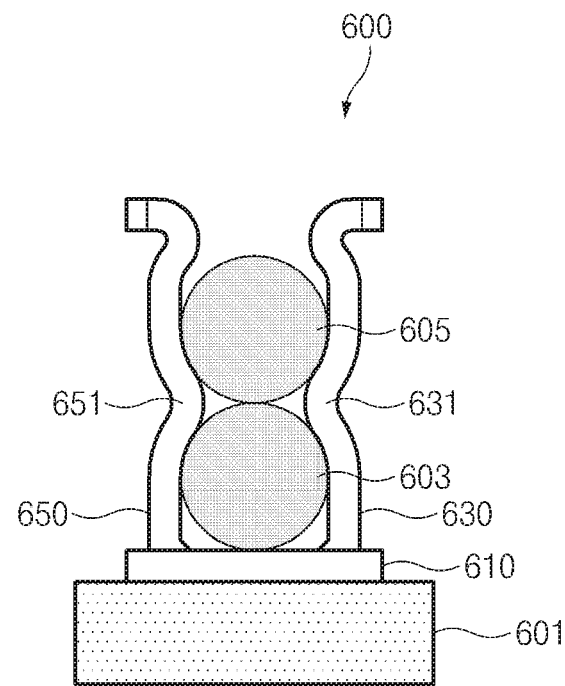
FIG. 6 is a view illustrating a cable fixing apparatus that includes fixing parts that may be attached to cables according to an embodiment.

FIG. 6 is a view illustrating a cable fixing apparatus that includes fixing parts that may be attached to cables according to an embodiment.

Referring to FIG. 6, the cable fixing apparatus 600 may more stably fix a first cable 603 and a second cable 605 as a first fixing part 630 and a second fixing part 650 that are installed in upright positions on a coupling part 610 coupled to a printed circuit board 601 may be attached to the first cable 603 and the second cable 605 that are inserted between the first fixing part 630 and the second fixing part 650. According to an embodiment, an intermediate portion 631 of the first fixing part 630 and an intermediate portion 651 of the second fixing part 650 may protrude to the inner widthwise direction of the coupling part 610. The protrusions of the intermediate portions may fix the first cable 603 while partially covering an upper side of the first cable 603, and may support a portion of the lower side of the second cable 605.

Figure 7:
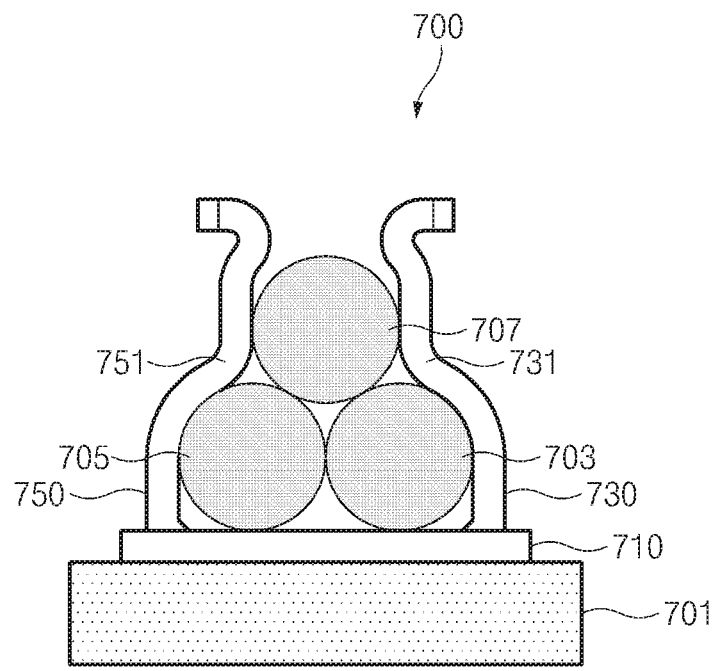
FIG. 7 is a view illustrating another form of a cable fixing apparatus that includes fixing parts that may be attached to cables according to an embodiment.

FIG. 7 is a view illustrating another form of a cable fixing apparatus that includes fixing parts that may be attached to cables according to an embodiment.

According to various embodiments, the cable fixing apparatus 700 may fix cables that are parallel to each other in a widthwise direction thereof, as well as cables that are stacked in a heightwise direction thereof, as in the cable fixing apparatus 600 of FIG. 6. Referring to FIG. 7, the coupling part 710 coupled to the printed circuit board 701 of the cable fixing apparatus 700 may have a width that corresponding to the number of the cables, which are positioned in parallel, and a total sum of the diameters of the cables such that the plurality of cables are positioned in parallel to each other. As illustrated in the drawing, the coupling part 710 may have a width that is larger than that of the coupling part 610 of FIG. 6 such that the first cable 703 and the second cable 705 may be positioned in parallel to each other in a widthwise direction of the cable fixing apparatus 700. Further, the interval between the first fixing part 730 and the second fixing part 750 installed in upright positions on the coupling part 710 may be provided to corresponding the number of the cables, which are positioned in parallel in a widthwise direction of the cable fixing apparatus 700, and a total sum of the diameters of the cable fixing apparatus 700.

According to various embodiments, a portion of the intermediate portion 731 of the first fixing part 730 and a portion of the intermediate portion 751 of the second fixing part 750 may protrude to the inner widthwise direction of the coupling part 170 to fix a third cable 707 stacked on the first cable 703 and the second cable 705. Because a total sum of the diameters of the first cable 703 and the second cable 705, which are situated on the lower side, is larger than the diameter of the third cable 707, which is situated on the upper side, the intermediate portion 731 of the first fixing part 730 and the intermediate portion 751 of the second fixing part 750 may protrude to the inner widthwise direction of the coupling part 710 such that the first fixing part 730 and the second fixing part 750 may contact one side surface of the third cable 707 to fix the third cable 707.

However, the shapes of the first fixing part 730 and the second fixing part 750 are not limited thereto. According to various embodiments, the shapes of the first fixing part 730 and the second fixing part 750 may be differently determined depending on the number of and the total sum of the diameters of the cables, which are situated on the lower side, and the number of and the total sum of the diameters of the cables, which are situated on the upper side. According to an embodiment, when the number of the cables situated on the lower side is the same as the number of the cables situated on the upper side and the total sums of the diameters of the cables are the same, the intermediate portion 731 of the first fixing part 730 and the intermediate portion 751 of the second fixing part 750 may have a flat shape. Further, as illustrated in FIG. 6, a portion of the intermediate portion 731 of the first fixing part 730 and the intermediate portion 751 of the second fixing part 750 may protrude to the inner widthwise direction of the coupling part 710. According to an embodiment, when the number of the cables situated on the lower side is smaller the number of the cables situated on the upper side and the total sum of the diameters of the cables on the lower side is the smaller, the intermediate portion 731 of the first fixing part 730 and the intermediate portion 751 of the second fixing part 750 may protrude to the outer widthwise direction of the coupling part 710.

Figure 8:
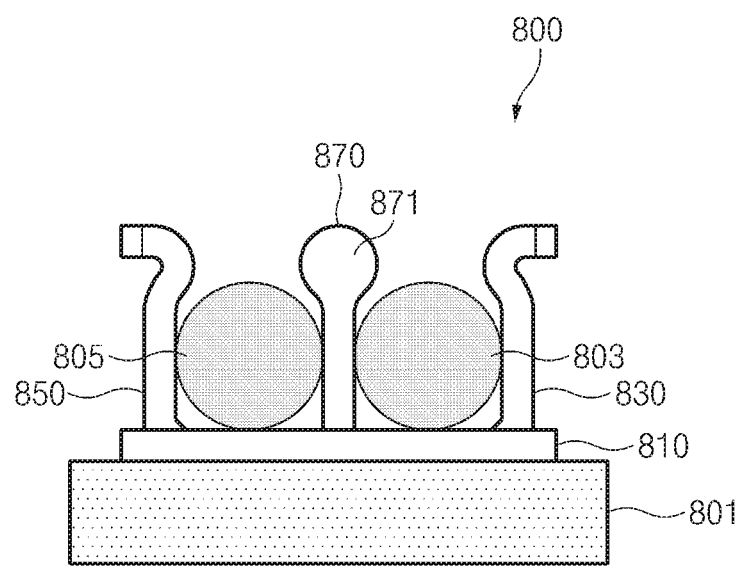
FIG. 8 is a view illustrating a cable fixing apparatus that includes fixing parts formed such that cables may be separated according to an embodiment.

FIG. 8 is a view illustrating a cable fixing apparatus that includes fixing parts formed such that cables may be separated according to an embodiment.

Referring to FIG. 8, the cable fixing apparatus 800 may be provided such that the cables, which are inserted into the cable fixing apparatus 800, do not contact each other. According to an embodiment, the cable fixing apparatus 800 may include a third fixing part 870, which is utilized as a partition wall, between the first fixing part 830 and the second fixing part 850. For example, the cable fixing apparatuses 800 may include a coupling part 810 that is coupled to a printed circuit board 801, a first fixing part 830 and a second fixing part 850 that extend from the coupling part 810 in a heightwise direction of the cable fixing apparatus 800, and a third fixing part 870 that is arranged between the first fixing part 830 and the second fixing part 850 and is installed in an upright position on the coupling part 810. In this case, the first cable 803 may be inserted between the first fixing part 830 and the third fixing part 870, and the second cable 805 may be inserted between the second fixing part 850 and the third fixing part 870. However, the present disclosure is not limited thereto. At least one pair of the first fixing part 830 and the third fixing part 870, or the second fixing part 850 and the third fixing part 870 may have a large height to fix a plurality of cables. For example, the first fixing part 830 and the third fixing part 870 may have a large height such that a third cable (not illustrated) as well as the first cable 803 may be inserted and fixed.

According to various embodiments, an upper peripheral portion may be excluded from the third fixing part 870 and the upper end portion 871 may protrude to opposite widthwise directions of the coupling part 810. For example, the upper end portion 871 of the third fixing part 870 may have a cylindrical shape that extends in a lengthwise direction of the cable fixing apparatus 800. Because the illustrated drawing is a side view of the cable fixing apparatus 800, the side surface of the upper end portion 871 has a circular (or elliptical) shape. As the upper end portion 871 of the third fixing part 870 protrudes to the opposite widthwise directions of the coupling part 810, the upper end portion 871 of the third fixing part 870 may guide the cables between the fixing parts (e.g., the first fixing part 830 and the third fixing part 870 or the second fixing part 850 and the third fixing part 870) such that the cables (e.g., a first cable 803 and a second cable 805) may be smoothly inserted, and may prevent the inserted cables from being separated to the outside.

Figure 9:
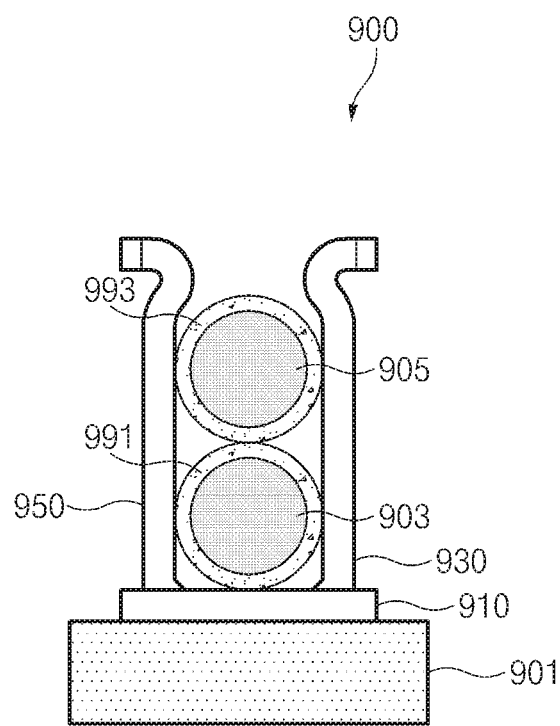
FIG. 9 is a view illustrating a cable fixing apparatus in which cables, to which protection members are coupled, are inserted according to an embodiment.

FIG. 9 is a view illustrating a cable fixing apparatus in which cables, to which protection members are coupled, are inserted according to an embodiment.

Referring to FIG. 9, portions of the cables inserted into the cable fixing apparatus 900 may be surrounded by the protection members such that the outer surfaces of the cable may be prevented from being damaged in a process of inserting the cables. As illustrated, a portion of a first cable 903 may be surrounded by a first protection member 991, and a portion of a second cable 905 may be surrounded by a second protection member 993.

According to an embodiment, the protection member may be formed of a conductive material. In this case, the protection members that surround portions of the cables may contact at least one of a coupling part 910 that is coupled to a printed circuit board 901, a first fixing part 930 that extends from a widthwise periphery of the coupling part 910 in a heightwise direction of the cable fixing apparatus 900, or a second fixing part 950 that extends from an opposite widthwise periphery of the coupling part 910 in a heightwise direction of the coupling part 910, to provide a ground area.

FIGS. 3A to 9 illustrate only one pair of fixing parts that are installed in upright positions to face each other in a widthwise direction of the cable fixing apparatus by showing a side surface of the cable fixing apparatus. However, the present disclosure is not limited thereto. According to various embodiments, at least one pair of fixing parts may be provided in a lengthwise direction of the cable fixing apparatus. For example, two pairs of fixing parts may be provided in the cable fixing apparatus such that a plurality of cables may be stably fixed.

As described above, according to various embodiments, an electronic device may include a housing that comprises a first surface that faces a first direction, a second surface that faces a second direction that is opposite to the first direction, and a side surface that surrounds at least a portion of a space between the first surface and the second surface, a first printed circuit board that is seated inside the housing, a second printed circuit board that is seated inside the housing, a plurality of cables that electrically connects the first printed circuit board and the second printed circuit board, and at least one cable fixing apparatus that is coupled to the first printed circuit board or the second printed circuit board to accommodate and fix the plurality of cables.

According to various embodiments, the at least one cable fixing apparatus may include a coupling part that defines a bottom of the at least one cable fixing apparatus, and one or more pairs of fixing parts that extend from one surface of the coupling part, are paired to be installed in upright positions in opposite widthwise directions of the coupling part so as to face each other, the pairs being arranged in a lengthwise direction of the coupling part.

According to various embodiments, the coupling part may include a central portion that is formed in a central area of the coupling part, a first peripheral area that is formed in a left peripheral area of the coupling part, a second peripheral area that is formed on a right peripheral area of the coupling part, a first extending portion that extends from a left side surface of the central portion and is connected with a right side surface of the first peripheral portion, and a second extending portion that extends from a right side surface of the central portion and is connected with a left side surface of the second peripheral portion. The one or more fixing parts may include a first fixing part and a second fixing part that are installed on the first extending portion, and a third fixing part and a fourth fixing part that are installed on the second extending portion.

According to various embodiments, the central portion, the first peripheral portion, and the second peripheral portion may have a first width and the first extending portion and the second extending portion may have a second width, and the first width is larger than the second width.

According to various embodiments, the central portion may have a first length, and the first peripheral portion and the second peripheral portion may have a second length, and the first length is larger than the second length.

According to various embodiments, at least a portion of the coupling part may be coupled to the first printed circuit board or the second printed circuit board. And a first cable and a second cable may be inserted between the fixing parts paired to be installed in the upright positions and are stacked and fixed in a heightwise direction of the cable fixing apparatus.

According to various embodiments, at least a portion of the coupling part may be coupled to the first printed circuit board or the second printed circuit board. A first cable, a second cable, and a third cable may be inserted between the fixing parts paired to be installed in the upright positions. The first cable and the second cable may be fixed in parallel in a widthwise direction of the cable fixing apparatus, and the third cable may be stacked on the first cable and the second cable to be fixed.

According to various embodiments, each of the fixing parts may include a lower end portion that extends from one side surface of the coupling part and is bent in a heightwise direction of the cable fixing apparatus, an intermediate portion that extends from the lower end portion, an upper end portion that extends from the intermediate portion and a portion of which protrudes inwards in a widthwise direction of the coupling part, and an upper peripheral portion that extends from the upper end portion to an outer widthwise direction of the coupling part.

According to various embodiments, a portion of the intermediate portion may protrude to an inner widthwise direction of the coupling part.

According to various embodiments, at least a portion of an outer surface of the fixing part or an outer surface of the coupling part may be coated with an insulation material.

According to various embodiments, the at least one cable fixing apparatus may include a first coupling part, at least a portion of which is coupled to the first printed circuit board or the second printed circuit board, a first fixing part and a second fixing part that extend from the first coupling part in a heightwise direction of the cable fixing apparatus, a second coupling part that extends from an upper periphery of the second fixing part to a side that is opposite to a side on which the first fixing part is arranged, to be parallel to the first coupling part, and a third fixing part and a fourth fixing part that extend from the second coupling part in a heightwise direction of the cable fixing apparatus.

According to various embodiments, a first cable may be inserted between the first fixing part and the second fixing part to be fixed, and a second cable may be inserted between the third fixing part and the fourth fixing part to be fixed.

According to various embodiments, the at least one cable fixing apparatus may include a coupling part, at least a portion of which is coupled to the first printed circuit board or the second printed circuit board, a first fixing part and a second fixing part that extend from the coupling part in a heightwise direction of the cable fixing apparatus, and a third fixing part that is arranged between the first fixing part and the second fixing part and is installed in an upright position on the coupling part.

According to various embodiments, a first cable may be inserted between the first fixing part and the third fixing part to be fixed, and a second cable may be inserted between the second fixing part and the third fixing part to be fixed.

According to various embodiments, an upper end of the third fixing part may protrude to opposite widthwise directions of the coupling part.

According to various embodiments, at least a portion of an outer surface of the at least one cable fixing apparatus may be coated with an insulation material.

According to various embodiments, the plurality of cables may be arranged along an inner surface of the housing, or arranged along an outer surface of a structure arranged inside the housing, and the at least one cable fixing apparatus may be arranged adjacent to the inner surface of the housing or the outer surface of the structure.

According to various embodiments, the at least one cable fixing apparatus may include a coupling part which defines a bottom of the cable fixing apparatus and at least a portion of which is coupled to the first printed circuit board or the second printed circuit board, and one or more pairs of fixing parts that extend from one surface of the coupling part, are paired to be installed in upright positions in opposite widthwise directions of the coupling part so as to face each other, the pairs being arranged in a lengthwise direction of the coupling part. And the plurality of cables may be inserted and fixed between the fixing parts paired to be installed in the upright positions.

According to various embodiments, the at least one cable fixing apparatus may include a coupling part which defines a bottom of the cable fixing apparatus, which is attached to an inner surface of the housing or an outer surface of the structure, and at least a portion of which is coupled to the first printed circuit board or the second printed circuit board, and at least one fixing part that extends from one surface of the coupling part and is installed in an upright position in a direction that is opposite to a direction in which the inner surface of the housing or the outer surface of the structure is provided, the at least one fixing parts being arranged in a lengthwise direction of the coupling part. And the plurality of cables may be inserted and fixed between the inner surface of the housing or the outer surface of the structure, and the at least one fixing part.

According to various embodiments, the electronic device may further include an insulation member that is arranged between the inner surface of the housing or the outer surface of the structure, and the at least one cable fixing apparatus.

Figure 10:
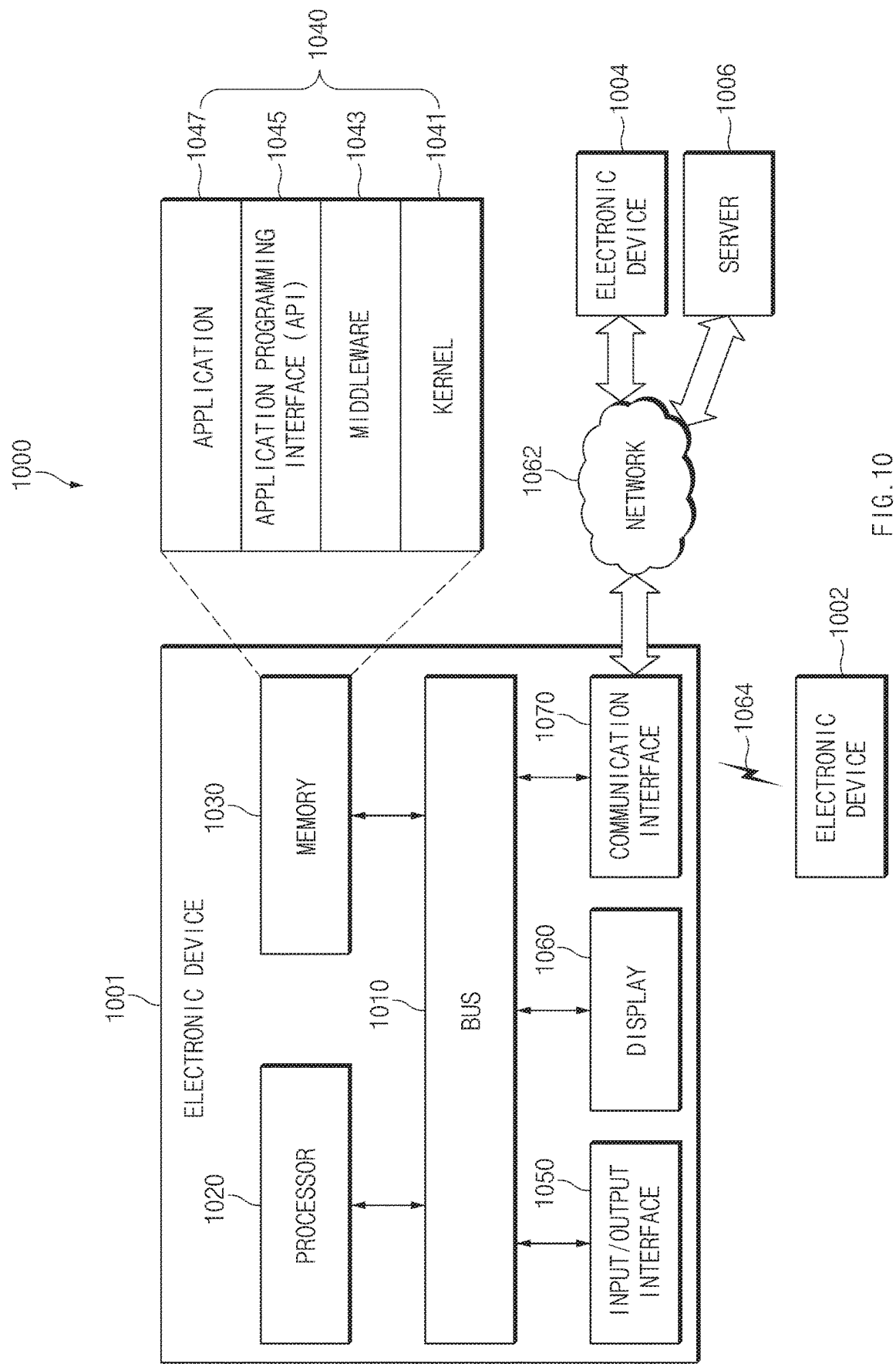
FIG. 10 illustrates an electronic device in a network environment according to an embodiment of the present disclosure.

FIG. 10 illustrates an electronic device in a network environment according to an embodiment of the present disclosure.

An electronic device 1001 in a network environment 1000 according to various embodiments of the present disclosure will be described with reference to FIG. 10. The electronic device 1001 may include a bus 1010, a processor 1020, a memory 1030, an input/output interface 1050, a display 1060, and a communication interface 1070. In various embodiments of the present disclosure, at least one of the foregoing elements may be omitted or another element may be added to the electronic device 1001.

The bus 1010 may include a circuit for connecting the above-mentioned elements 1010 to 1070 to each other and transferring communications (e.g., control messages and/or data) among the above-mentioned elements.

The processor 1020 may include at least one of a central processing unit (CPU), an application processor (AP), or a communication processor (CP). The processor 1020 may perform data processing or an operation related to communication and/or control of at least one of the other elements of the electronic device 1001.

The memory 1030 may include a volatile memory and/or a nonvolatile memory. The memory 1030 may store instructions or data related to at least one of the other elements of the electronic device 1001. According to an embodiment of the present disclosure, the memory 1030 may store software and/or a program 1040. The program 1040 may include, for example, a kernel 1041, a middleware 1043, an application programming interface (API) 1045, and/or an application program (or an application) 1047. At least a portion of the kernel 1041, the middleware 1043, or the API 1045 may be referred to as an operating system (OS).

The kernel 1041 may control or manage system resources (e.g., the bus 1010, the processor 1020, the memory 1030, or the like) used to perform operations or functions of other programs (e.g., the middleware 1043, the API 1045, or the application program 1047). Furthermore, the kernel 1041 may provide an interface for allowing the middleware 1043, the API 1045, or the application program 1047 to access individual elements of the electronic device 1001 in order to control or manage the system resources.

The middleware 1043 may serve as an intermediary so that the API 1045 or the application program 1047 communicates and exchanges data with the kernel 1041.

Furthermore, the middleware 1043 may handle one or more task requests received from the application program 1047 according to a priority order. For example, the middleware 1043 may assign at least one application program 1047 a priority for using the system resources (e.g., the bus 1010, the processor 1020, the memory 1030, or the like) of the electronic device 1001. For example, the middleware 1043 may handle the one or more task requests according to the priority assigned to the at least one application, thereby performing scheduling or load balancing with respect to the one or more task requests.

The API 1045, which is an interface for allowing the application 1047 to control a function provided by the kernel 1041 or the middleware 1043, may include, for example, at least one interface or function (e.g., instructions) for file control, window control, image processing, character control, or the like.

The input/output interface 1050 may serve to transfer an instruction or data input from a user or another external device to (an)other element(s) of the electronic device 1001. Furthermore, the input/output interface 1050 may output instructions or data received from (an)other element(s) of the electronic device 1001 to the user or another external device.

The display 1060 may include, for example, a liquid crystal display (LCD), a light-emitting diode (LED) display, an organic light-emitting diode (OLED) display, a microelectromechanical systems (MEMS) display, or an electronic paper display. The display 1060 may present various content (e.g., a text, an image, a video, an icon, a symbol, or the like) to the user. The display 1060 may include a touch screen, and may receive a touch, gesture, proximity or hovering input from an electronic pen or a part of a body of the user.

The communication interface 1070 may set communications between the electronic device 1001 and an external device (e.g., a first external electronic device 1002, a second external electronic device 1004, or a server 1006). For example, the communication interface 1070 may be connected to a network 1062 via wireless communications or wired communications so as to communicate with the external device (e.g., the second external electronic device 1004 or the server 1006).

The wireless communications may employ at least one of cellular communication protocols such as long-term evolution (LTE), LTE-advance (LTE-A), code division multiple access (CDMA), wideband CDMA (WCDMA), universal mobile telecommunications system (UMTS), wireless broadband (WiBro), or global system for mobile communications (GSM). The wireless communications may include, for example, a short-range communications 1064. The short-range communications may include at least one of wireless fidelity (Wi-Fi), Bluetooth, near field communication (NFC), magnetic stripe transmission (MST), or GNSS.

The MST may generate pulses according to transmission data and the pulses may generate electromagnetic signals. The electronic device 1001 may transmit the electromagnetic signals to a reader device such as a POS (point of sales) device. The POS device may detect the magnetic signals by using a MST reader and restore data by converting the detected electromagnetic signals into electrical signals.

The GNSS may include, for example, at least one of global positioning system (GPS), global navigation satellite system (GLONASS), BeiDou navigation satellite system (BeiDou), or Galileo, the European global satellite-based navigation system according to a use area or a bandwidth. Hereinafter, the term "GPS" and the term "GNSS" may be interchangeably used. The wired communications may include at least one of universal serial bus (USB), high definition multimedia interface (HDMI), recommended standard 832 (RS-232), plain old telephone service (POTS), or the like. The network 1062 may include at least one of telecommunications networks, for example, a computer network (e.g., local area network (LAN) or wide area network (WAN)), the Internet, or a telephone network.

The types of the first external electronic device 1002 and the second external electronic device 1004 may be the same as or different from the type of the electronic device 1001. According to an embodiment of the present disclosure, the server 1006 may include a group of one or more servers. A portion or all of operations performed in the electronic device 1001 may be performed in one or more other electronic devices (e.g., the first electronic device 1002, the second external electronic device 1004, or the server 1006). When the electronic device 1001 should perform a certain function or service automatically or in response to a request, the electronic device 1001 may request at least a portion of functions related to the function or service from another device (e.g., the first electronic device 1002, the second external electronic device 1004, or the server 1006) instead of or in addition to performing the function or service for itself. The other electronic device (e.g., the first electronic device 1002, the second external electronic device 1004, or the server 1006) may perform the requested function or additional function, and may transfer a result of the performance to the electronic device 1001. The electronic device 1001 may use a received result itself or additionally process the received result to provide the requested function or service. To this end, for example, a cloud computing technology, a distributed computing technology, or a client-server computing technology may be used.

Figure 11:
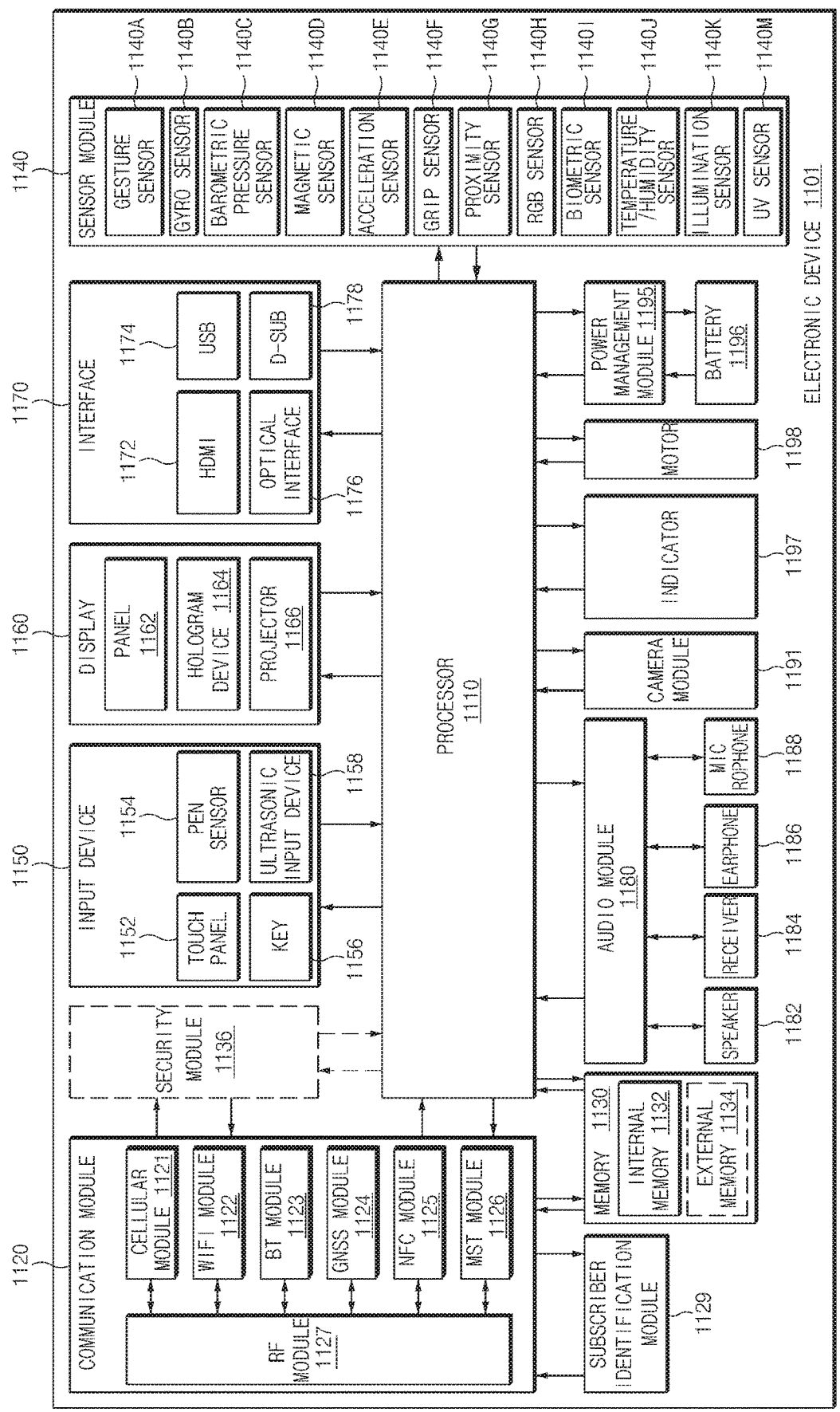
FIG. 11 is a block diagram illustrating a configuration of an electronic device according to an embodiment of the present disclosure.

FIG. 11 is a block diagram illustrating a configuration of an electronic device according to an embodiment of the present disclosure.

Referring to FIG. 11, the electronic device 1101 may include, for example, all or part of an electronic device 1001 shown in FIG. 10. The electronic device 1101 may include one or more processors 1110 (e.g., application processors (APs)), a communication module 1120, a subscriber identification module (SIM) 1129, a memory 1130, a security module 1136, a sensor module 1140, an input device 1150, a display 1160, an interface 1170, an audio module 1180, a camera module 1191, a power management module 1195, a battery 1196, an indicator 1197, and a motor 1198.

The processor 1110 may drive, for example, an operating system (OS) or an application program to control a plurality of hardware or software components connected thereto and may process and compute a variety of data. The processor 1110 may be implemented with, for example, a system on chip (SoC). According to an embodiment of the present disclosure, the processor 1110 may include a graphic processing unit (GPU) (not shown) and/or an image signal processor (not shown). The processor 1110 may include at least some (e.g., a cellular module 1121) of the components shown in FIG. 11. The processor 1110 may load a command or data received from at least one of other components (e.g., a non-volatile memory) into a volatile memory to process the data and may store various data in a non-volatile memory.

The communication module 1120 may have the same or similar configuration to the communication interface 1070 of FIG. 10. The communication module 1120 may include, for example, the cellular module 1121, a wireless-fidelity (Wi-Fi) module 1122, a Bluetooth (BT) module 1123, a global navigation satellite system (GNSS) module 1124 (e.g., a GPS module, a Glonass module, a Beidou module, or a Galileo module), a near field communication (NFC) module 1125, an MST module 1126, and a radio frequency (RF) module 1127.

The cellular module 1121 may provide, for example, a voice call service, a video call service, a text message service, or an Internet service, and the like through a communication network. According to an embodiment of the present disclosure, the cellular module 1121 may identify and authenticate the electronic device 1101 in a communication network using the SIM 1129 (e.g., a SIM card). According to an embodiment of the present disclosure, the cellular module 1121 may perform at least part of functions which may be provided by the processor 1110. According to an embodiment of the present disclosure, the cellular module 1121 may include a communication processor (CP).

The Wi-Fi module 1122, the BT module 1123, the GNSS module 1124, the NFC module 1125, or the MST module 1126 may include, for example, a processor for processing data transmitted and received through the corresponding module. According to various embodiments of the present disclosure, at least some (e.g., two or more) of the cellular module 1121, the Wi-Fi module 1122, the BT module 1123, the GNSS module 1124, the NFC module 1125, or the MST module 1126 may be included in one integrated chip (IC) or one IC package.

The RF module 1127 may transmit and receive, for example, a communication signal (e.g., an RF signal). Though not shown, the RF module 1127 may include, for example, a transceiver, a power amplifier module (PAM), a frequency filter, or a low noise amplifier (LNA), or an antenna, and the like. According to another embodiment of the present disclosure, at least one of the cellular module 1121, the Wi-Fi module 1122, the BT module 1123, the GNSS module 1124, the NFC module 1125, or the MST module 1126 may transmit and receive an RF signal through a separate RF module.

The SIM 1129 may include, for example, a card which includes a SIM and/or an embedded SIM. The SIM 1129 may include unique identification information (e.g., an integrated circuit card identifier (ICCID)) or subscriber information (e.g., an international mobile subscriber identity (IMSI)).

The memory 1130 (e.g., a memory 1030 of FIG. 10) may include, for example, an embedded memory 1132 or an external memory 1134. The embedded memory 1132 may include at least one of, for example, a volatile memory (e.g., a dynamic random access memory (DRAM), a static RAM (SRAM), a synchronous dynamic RAM (SDRAM), and the like), or a non-volatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory, and the like), a hard drive, or a solid state drive (SSD)).

The external memory 1134 may include a flash drive, for example, a compact flash (CF), a secure digital (SD), a micro-SD, a mini-SD, an extreme digital (xD), a multimedia car (MMC), or a memory stick, and the like. The external memory 1134 may operatively and/or physically connect with the electronic device 1101 through various interfaces.

The security module 1136 may be a module which has a relatively higher secure level than the memory 1130 and may be a circuit which stores secure data and guarantees a protected execution environment. The security module 1136 may be implemented with a separate circuit and may include a separate processor. The security module 1136 may include, for example, an embedded secure element (eSE) which is present in a removable smart chip or a removable SD card or is embedded in a fixed chip of the electronic device 1101. Also, the security module 1136 may be driven by an OS different from the OS of the electronic device 1101. For example, the security module 1136 may operate based on a java card open platform (JCOP) OS.

The sensor module 1140 may measure, for example, a physical quantity or may detect an operation state of the electronic device 1101, and may convert the measured or detected information to an electric signal. The sensor module 1140 may include at least one of, for example, a gesture sensor 1140A, a gyro sensor 1140B, a barometric pressure sensor 1140C, a magnetic sensor 1140D, an acceleration sensor 1140E, a grip sensor 1140F, a proximity sensor 1140G, a color sensor 1140H (e.g., red, green, blue (RGB) sensor), a biometric sensor 1140I, a temperature/humidity sensor 1140J, an illumination sensor 1140K, or an ultraviolet (UV) sensor 1140M. Additionally or alternatively, the sensor module 1140 may further include, for example, an e-nose sensor (not shown), an electromyography (EMG) sensor (not shown), an electroencephalogram (EEG) sensor (not shown), an electrocardiogram (ECG) sensor (not shown), an infrared (IR) sensor (not shown), an iris sensor (not shown), and/or a fingerprint sensor (not shown), and the like. The sensor module 1140 may further include a control circuit for controlling at least one or more sensors included therein. According to various embodiments of the present disclosure, the electronic device 1101 may further include a processor configured to control the sensor module 1140, as part of the processor 1110 or to be independent of the processor 1110. While the processor 1110 is in a sleep state, the electronic device 1101 may control the sensor module 1140.

The input device 1150 may include, for example, a touch panel 1152, a (digital) pen sensor 1154, a key 1156, or an ultrasonic input device 1158. The touch panel 1152 may use at least one of, for example, a capacitive type, a resistive type, an infrared type, or an ultrasonic type. Also, the touch panel 1152 may further include a control circuit. The touch panel 1152 may further include a tactile layer and may provide a tactile reaction to a user.

The (digital) pen sensor 1154 may be, for example, part of the touch panel 1152 or may include a separate sheet for recognition. The key 1156 may include, for example, a physical button, an optical key, or a keypad. The ultrasonic input device 1158 may allow the electronic device 1101 to detect a sound wave using a microphone (e.g., a microphone 1188) and to verify data through an input tool generating an ultrasonic signal.

The display 1160 (e.g., a display 1060 of FIG. 10) may include a panel 1162, a hologram device 1164, or a projector 1166. The panel 1162 may include the same or similar configuration to the display 1060. The panel 1162 may be implemented to be, for example, flexible, transparent, or wearable. The panel 1162 and the touch panel 1152 may be integrated into one module. The hologram device 1164 may show a stereoscopic image in a space using interference of light. The projector 1166 may project light onto a screen to display an image. The screen may be positioned, for example, inside or outside the electronic device 1101. According to an embodiment of the present disclosure, the display 1160 may further include a control circuit for controlling the panel 1162, the hologram device 1164, or the projector 1166.

The interface 1170 may include, for example, a high-definition multimedia interface (HDMI) 1172, a universal serial bus (USB) 1174, an optical interface 1176, or a D-subminiature 1178. The interface 1170 may be included in, for example, the communication interface 1070 shown in FIG. 10. Additionally or alternatively, the interface 1170 may include, for example, a mobile high definition link (MHL) interface, an SD card/multimedia card (MMC) interface, or an infrared data association (IrDA) standard interface.

The audio module 1180 may convert a sound and an electric signal in dual directions. At least part of components of the audio module 1180 may be included in, for example, an input and output interface 1050 (or a user interface) shown in FIG. 10. The audio module 1180 may process sound information input or output through, for example, a speaker 1182, a receiver 1184, an earphone 1186, or the microphone 1188, and the like.

The camera module 1191 may be a device which captures a still image and a moving image. According to an embodiment of the present disclosure, the camera module 1191 may include one or more image sensors (not shown) (e.g., a front sensor or a rear sensor), a lens (not shown), an image signal processor (ISP) (not shown), or a flash (not shown) (e.g., an LED or a xenon lamp).

The power management module 1195 may manage, for example, power of the electronic device 1101. According to an embodiment of the present disclosure, though not shown, the power management module 1195 may include a power management integrated circuit (PMIC), a charger IC or a battery or fuel gauge. The PMIC may have a wired charging method and/or a wireless charging method. The wireless charging method may include, for example, a magnetic resonance method, a magnetic induction method, or an electromagnetic method, and the like. An additional circuit for wireless charging, for example, a coil loop, a resonance circuit, or a rectifier, and the like may be further provided. The battery gauge may measure, for example, the remaining capacity of the battery 1196 and voltage, current, or temperature thereof while the battery 1196 is charged. The battery 1196 may include, for example, a rechargeable battery or a solar battery.

The indicator 1197 may display a specific state of the electronic device 1101 or part (e.g., the processor 1110) thereof, for example, a booting state, a message state, or a charging state, and the like. The motor 1198 may convert an electric signal into mechanical vibration and may generate vibration or a haptic effect, and the like. Though not shown, the electronic device 1101 may include a processing unit (e.g., a GPU) for supporting a mobile TV. The processing unit for supporting the mobile TV may process media data according to standards, for example, a digital multimedia broadcasting (DMB) standard, a digital video broadcasting (DVB) standard, or a MediaFLO™ standard, and the like.

Each of the above-mentioned elements of the electronic device according to various embodiments of the present disclosure may be configured with one or more components, and names of the corresponding elements may be changed according to the type of the electronic device. The electronic device according to various embodiments of the present disclosure may include at least one of the above-mentioned elements, some elements may be omitted from the electronic device, or other additional elements may be further included in the electronic device. Also, some of the elements of the electronic device according to various embodiments of the present disclosure may be combined with each other to form one entity, thereby making it possible to perform the functions of the corresponding elements in the same manner as before the combination.

Figure 12:
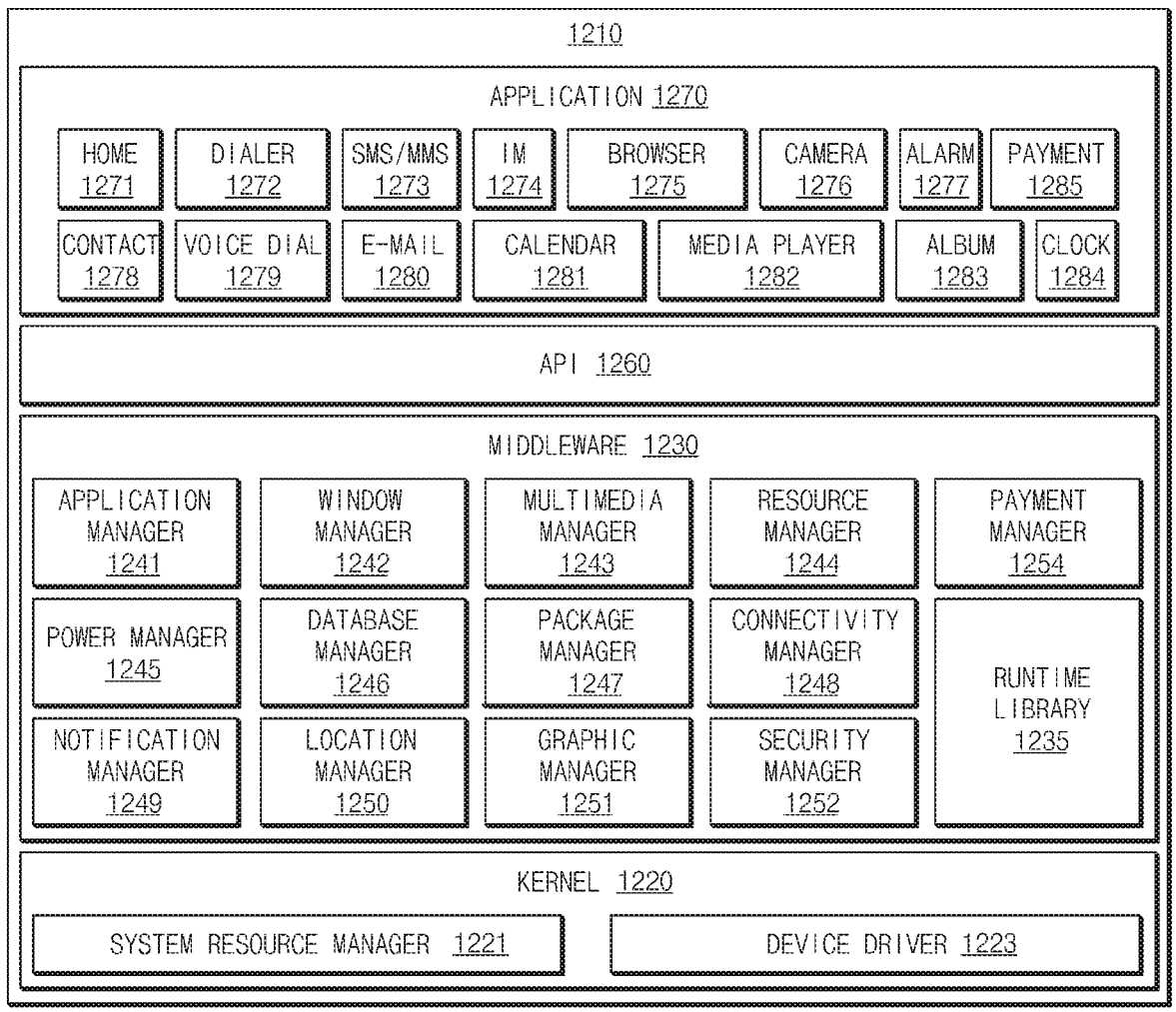
FIG. 12 is a block diagram illustrating a configuration of a program module 1210 according to an embodiment of the present disclosure.

FIG. 12 is a block diagram illustrating a configuration of a program module 1210 according to an embodiment of the present disclosure.

According to an embodiment of the present disclosure, the program module 1210 (e.g., a program 1040 of FIG. 10) may include an operating system (OS) for controlling resources associated with an electronic device (e.g., an electronic device 1001 of FIG. 10) and/or various applications (e.g., an application program 1047 of FIG. 10) which are executed on the OS. The OS may be, for example, Android, iOS, Windows, Symbian, Tizen, or Bada, and the like.

The program module 1210 may include a kernel 1220, a middleware 1230, an application programming interface (API) 1260, and/or an application 1270. At least part of the program module 1210 may be preloaded on the electronic device, or may be downloaded from an external electronic device (e.g., a first external electronic device 1002, a second external electronic device 1004, or a server 1006, and the like of FIG. 10).

The kernel 1220 (e.g., a kernel 1041 of FIG. 10) may include, for example, a system resource manager 1221 and/or a device driver 1223. The system resource manager 1221 may control, assign, or collect, and the like system resources. According to an embodiment of the present disclosure, the system resource manager 1221 may include a process management unit, a memory management unit, or a file system management unit, and the like. The device driver 1223 may include, for example, a display driver, a camera driver, a Bluetooth (BT) driver, a shared memory driver, a universal serial bus (USB) driver, a keypad driver, a wireless-fidelity (Wi-Fi) driver, an audio driver, or an inter-process communication (IPC) driver.

The middleware 1230 (e.g., a middleware 1043 of FIG. 10) may provide, for example, functions the application 1270 needs in common, and may provide various functions to the application 1270 through the API 1260 such that the application 1270 efficiently uses limited system resources in the electronic device. According to an embodiment of the present disclosure, the middleware 1230 (e.g., the middleware 1043) may include at least one of a runtime library 1235, an application manager 1241, a window manager 1242, a multimedia manager 1243, a resource manager 1244, a power manager 1245, a database manager 1246, a package manager 1247, a connectivity manager 1248, a notification manager 1249, a location manager 1250, a graphic manager 1251, a security manager 1252, or a payment manager 1254.

The runtime library 1235 may include, for example, a library module used by a compiler to add a new function through a programming language while the application 1270 is executed. The runtime library 1235 may perform a function about input and output management, memory management, or an arithmetic function.

The application manager 1241 may manage, for example, a life cycle of at least one of the application 1270. The window manager 1242 may manage graphic user interface (GUI) resources used on a screen of the electronic device. The multimedia manager 1243 may determine a format utilized for reproducing various media files and may encode or decode a media file using a codec corresponding to the corresponding format. The resource manager 1244 may manage source codes of at least one of the application 1270, and may manage resources of a memory or a storage space, and the like.

The power manager 1245 may act together with, for example, a basic input/output system (BIOS) and the like, may manage a battery or a power source, and may provide power information utilized for an operation of the electronic device. The database manager 1246 may generate, search, or change a database to be used in at least one of the application 1270. The package manager 1247 may manage installation or update of an application distributed by a type of a package file.

The connectivity manager 1248 may manage, for example, wireless connection such as Wi-Fi connection or BT connection, and the like. The notification manager 1249 may display or notify events, such as an arrival message, an appointment, and proximity notification, by a method which is not disturbed to the user. The location manager 1250 may manage location information of the electronic device. The graphic manager 1251 may manage a graphic effect to be provided to the user or a user interface (UI) related to the graphic effect. The security manager 1252 may provide all security functions utilized for system security or user authentication, and the like. According to an embodiment of the present disclosure, when the electronic device (e.g., an electronic device 1001 of FIG. 10) has a phone function, the middleware 1230 may further include a telephony manager (not shown) for managing a voice or video communication function of the electronic device.

The middleware 1230 may include a middleware module which configures combinations of various functions of the above-described components. The middleware 1230 may provide a module which specializes according to kinds of OSs to provide a differentiated function. Also, the middleware 1230 may dynamically delete some of old components or may add new components.

The API 1260 (e.g., an API 1045 of FIG. 10) may be, for example, a set of API programming functions, and may be provided with different components according to OSs. For example, in case of Android or iOS, one API set may be provided according to platforms. In case of Tizen, two or more API sets may be provided according to platforms.

The application 1270 (e.g., an application program 1047 of FIG. 10) may include one or more of, for example, a home application 1271, a dialer application 1272, a short message service/multimedia message service (SMS/MMS) application 1273, an instant message (IM) application 1274, a browser application 1275, a camera application 1276, an alarm application 1277, a contact application 1278, a voice dial application 1279, an e-mail application 1280, a calendar application 1281, a media player application 1282, an album application 1283, a clock application 1284, a payment application 1285, a health care application (e.g., an application for measuring quantity of exercise or blood sugar, and the like), or an environment information application (e.g., an application for providing atmospheric pressure information, humidity information, or temperature information, and the like), and the like.

According to an embodiment of the present disclosure, the application 1270 may include an application (hereinafter, for better understanding and ease of description, referred to as "information exchange application") for exchanging information between the electronic device (e.g., the electronic device 1001 of FIG. 10) and an external electronic device (e.g., the first external electronic device 1002 or the second external electronic device 1004). The information exchange application may include, for example, a notification relay application for transmitting specific information to the external electronic device or a device management application for managing the external electronic device.

For example, the notification relay application may include a function of transmitting notification information, which is generated by other applications (e.g., the SMS/MMS application, the e-mail application, the health care application, or the environment information application, and the like) of the electronic device, to the external electronic device (e.g., the first external electronic device 1002 or the second external electronic device 1004). Also, the notification relay application may receive, for example, notification information from the external electronic device, and may provide the received notification information to the user of the electronic device.

The device management application may manage (e.g., install, delete, or update), for example, at least one (e.g., a function of turning on/off the external electronic device itself (or partial components) or a function of adjusting brightness (or resolution) of a display) of functions of the external electronic device (e.g., the first external electronic device 1002 or the second external electronic device 1004)

which communicates with the electronic device, an application which operates in the external electronic device, or a service (e.g., a call service or a message service) provided from the external electronic device.

According to an embodiment of the present disclosure, the application 1270 may include an application (e.g., the health card application of a mobile medical device) which is preset according to attributes of the external electronic device (e.g., the first external electronic device 1002 or the second external electronic device 1004). According to an embodiment of the present disclosure, the application 1270 may include an application received from the external electronic device (e.g., the server 1006, the first external electronic device 1002, or the second external electronic device 1004). According to an embodiment of the present disclosure, the application 1270 may include a preloaded application or a third party application which may be downloaded from a server. Names of the components of the program module 1210 according to various embodiments of the present disclosure may differ according to kinds of OSs.

According to various embodiments of the present disclosure, at least part of the program module 1210 may be implemented with software, firmware, hardware, or at least two or more combinations thereof. At least part of the program module 1210 may be implemented (e.g., executed) by, for example, a processor (e.g., a processor 1110). At least part of the program module 1210 may include, for example, a module, a program, a routine, sets of instructions, or a process, and the like for performing one or more functions.

According to the embodiments of the present disclosure, the mounting spaces for the electronic components may be secured by using the cable fixing apparatus that may receive a plurality of cables instead of using separate cable fixing apparatuses for the cables.

In addition, the present disclosure may provide various effects that are directly or indirectly recognized.

The term "module" used herein may represent, for example, a unit including one of hardware, software and firmware or a combination thereof. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific integrated circuit (ASIC) chip, a field-programmable gate array (FPGA), and a programmable-logic device for performing some operations, which are known or will be developed.

At least a part of devices (e.g., modules or functions thereof) or methods (e.g., operations) according to various embodiments of the present disclosure may be implemented as instructions stored in a computer-readable storage medium in the form of a program module. In the case where the instructions are performed by a processor (e.g., the processor 1020), the processor may perform functions corresponding to the instructions. The computer-readable storage medium may be, for example, the memory 1030.

A computer-readable recording medium may include a hard disk, a floppy disk, a magnetic medium (e.g., a magnetic tape), an optical medium (e.g., CD-ROM, digital versatile disc (DVD)), a magneto-optical medium (e.g., a floptical disk), or a hardware device (e.g., a ROM, a RAM, a flash memory, or the like). The program instructions may include machine language codes generated by compilers and high-level language codes that can be executed by computers using interpreters. The above-mentioned hardware device may be configured to be operated as one or more software modules for performing operations of various embodiments of the present disclosure and vice versa.

A module or a program module according to various embodiments of the present disclosure may include at least one of the above-mentioned elements, or some elements may be omitted or other additional elements may be added. Operations performed by the module, the program module or other elements according to various embodiments of the present disclosure may be performed in a sequential, parallel, iterative or heuristic way. Furthermore, some operations may be performed in another order or may be omitted, or other operations may be added.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electronic device comprising:
    a housing comprising:
        a first surface facing a first direction,
        a second surface facing a second direction opposite to the first direction, and
        a side surface surrounding at least a portion of a space between the first surface and the second surface;
    a first printed circuit board seated inside the housing;
    a second printed circuit board seated inside the housing and spaced apart from the first printed circuit board;
    a battery frame provided such that a battery seated in an area of the housing;
    a first cable and a second cable configured to electrically connect the first printed circuit board and the second printed circuit board; and
    a cable fixing apparatus coupled to the first printed circuit board or the second printed circuit board to accommodate and fix the first cable and the second cable,
    wherein the cable fixing apparatus includes a first cable fixing apparatus disposed at one side of a corner area of the battery frame and a second cable fixing apparatus disposed at another side of the corner area of the battery frame,
    wherein a portion of the first and second cables fixed by the first cable fixing apparatus and a portion of the first and second cables fixed by the second cable fixing apparatus extend in a direction perpendicular to each other,
    wherein the cable fixing apparatus includes:
        a coupling part including a seating surface on which the first cable or the second cable is seated and a coupling surface opposed to the seating surface and including a coupling surface disposed on the first printed circuit board or the second printed circuit board, and
        a pair of fixing parts facing each other and extending from the seating surface by bending so as to provide an elastic force in a direction approaching each other, wherein the first cable and the second cable are stacked and arranged between the pair of fixing parts, and
    wherein the pair of fixing parts are spaced from each other by a distance corresponding to a diameter of the first and second cables and include a protruding portion protruding toward the first cable and the second cable, wherein the distance between protruding portions is formed smaller than the diameter of the first and second cables.

2. The electronic device of claim 1, wherein the coupling part comprises:
a central portion formed in a central area of the coupling part;
a first peripheral area formed in a left peripheral area of the coupling part;
a second peripheral area formed on a right peripheral area of the coupling part;
a first extending portion extending from a left side surface of the central portion and connected with a right side surface of the first peripheral area; and
a second extending portion extending from a right side surface of the central portion and connected with a left side surface of the second peripheral area,
wherein the pair of fixing parts comprise:
a first fixing part and a second fixing part disposed on the first extending portion, and
a third fixing part and a fourth fixing part disposed on the second extending portion.

3. The electronic device of claim 2, wherein:
the central portion, the first peripheral area, and the second peripheral area have a first width,
the first extending portion and the second extending portion have a second width, and
the first width is larger than the second width.

4. The electronic device of claim 2, wherein:
the central portion has a first length,
the first peripheral area and the second peripheral area have a second length, and
the first length is larger than the second length.

5. The electronic device of claim 1, wherein:
at least a portion of the coupling part is coupled to the first printed circuit board or the second printed circuit board, and
the first cable and the second cable are stacked and fixed in a heightwise direction of the cable fixing apparatus.

6. The electronic device of claim 1, further comprising:
a third cable inserted between the pair of fixing parts, wherein:
at least a portion of the coupling part is coupled to the first printed circuit board or the second printed circuit board,
the first cable and the second cable are fixed in parallel in a widthwise direction of the cable fixing apparatus, and
the third cable is stacked on the first cable and the second cable to be fixed.

7. The electronic device of claim 1, wherein at least a portion of an outer surface of the pair of fixing parts or an outer surface of the coupling part is coated with an insulation material.

8. The electronic device of claim 1, wherein the cable fixing apparatus comprises:
a first coupling part, at least a portion of the first coupling part is coupled to the first printed circuit board or the second printed circuit board;
a first fixing part and a second fixing part extending from the first coupling part in a heightwise direction of the cable fixing apparatus;
a second coupling part extending from an upper periphery of the second fixing part to a side opposite to a side on which the first fixing part is arranged, to be parallel to the first coupling part; and
a third fixing part and a fourth fixing part extending from the second coupling part in a heightwise direction of the cable fixing apparatus.

9. The electronic device of claim 8, wherein:
the first cable is inserted between the first fixing part and the second fixing part to be fixed, and
the second cable is inserted between the third fixing part and the fourth fixing part to be fixed.

10. The electronic device of claim 1, wherein the cable fixing apparatus comprises:
a coupling part, at least a portion of the coupling part is coupled to the first printed circuit board or the second printed circuit board;
a first fixing part and a second fixing part extending from the coupling part in a heightwise direction of the cable fixing apparatus; and
a third fixing part arranged between the first fixing part and the second fixing part and disposed in upright position on the coupling part.

11. The electronic device of claim 10, wherein:
the first cable is inserted between the first fixing part and the third fixing part to be fixed, and
the second cable is inserted between the second fixing part and the third fixing part to be fixed.

12. The electronic device of claim 10, wherein an upper end of the third fixing part protrudes to opposite widthwise directions of the coupling part.

13. The electronic device of claim 1, wherein at least a portion of an outer surface of the cable fixing apparatus is coated with an insulation material.

14. The electronic device of claim 1, wherein:
the first cable and the second cable are arranged along an inner surface of the housing or are arranged along an outer surface of a structure arranged inside the housing, and
the cable fixing apparatus is arranged adjacent to the inner surface of the housing or the outer surface of the structure.

15. The electronic device of claim 14, wherein the cable fixing apparatus comprises:
a coupling part defining a bottom of the cable fixing apparatus and at least a portion of the coupling part is coupled to the first printed circuit board or the second printed circuit board; and
one or more pairs of fixing parts extending from a surface of the coupling part,
wherein the one or more pairs of fixing parts are disposed in upright positions on the surface of the coupling part, and arranged in a lengthwise direction of the coupling part, and
wherein the first cable and the second cable are inserted and fixed between the one or more pairs of fixing parts.

16. The electronic device of claim 14, wherein the cable fixing apparatus comprises:
a coupling part defining a bottom of the cable fixing apparatus, which is attached to the inner surface of the housing or the outer surface of the structure, and at least a portion of the coupling part is coupled to the first printed circuit board or the second printed circuit board; and
at least one fixing part extending from a surface of the coupling part,
wherein the at least one fixing part is disposed in upright position in a direction that is opposite to a direction in which the inner surface of the housing or the outer surface of the structure is located, and arranged in a lengthwise direction of the coupling part, and wherein the first cable and the second cable are inserted and fixed between the inner surface of the housing or the outer surface of the structure, and the at least one fixing part.

17. The electronic device of claim 14, further comprises:
an insulation member arranged between the inner surface of the housing or the outer surface of the structure, and the cable fixing apparatus.

* * * * *